United States Patent [19]

Hart et al.

[11] Patent Number: 4,672,555

[45] Date of Patent: Jun. 9, 1987

[54] DIGITAL AC MONITOR

[75] Inventors: George W. Hart, Natick; Edward C. Kern, Jr., Lincoln, both of Mass.

[73] Assignee: Massachusetts Institute of Technology, Cambridge, Mass.

[21] Appl. No.: 662,392

[22] Filed: Oct. 18, 1984

[51] Int. Cl.[4] .................... G01R 19/00; G01R 21/00; G06F 15/20

[52] U.S. Cl. ................... 364/483; 364/481; 324/142

[58] Field of Search ............. 364/481, 483, 484, 575; 324/73 AT, 142, 77 A

[56] References Cited

U.S. PATENT DOCUMENTS

| | | | |
|---|---|---|---|
| Re. 31,774 | 12/1984 | Fletcher et al. | 364/483 |
| 3,758,763 | 9/1973 | Noham et al. | 364/487 |
| 4,055,801 | 10/1977 | Pike et al. | 324/73 R |
| 4,077,061 | 2/1978 | Johnston et al. | 364/492 |
| 4,107,778 | 3/1978 | Nii et al. | 364/492 |
| 4,150,432 | 4/1979 | Sorden | 364/484 |
| 4,276,605 | 6/1981 | Okamoto et al. | 364/483 |
| 4,333,149 | 6/1982 | Taylor et al. | 364/481 |
| 4,365,302 | 12/1982 | Elms | 364/483 |
| 4,445,183 | 4/1984 | McCollum et al. | 364/483 |
| 4,509,128 | 4/1985 | Coppola et al. | 364/483 |
| 4,530,045 | 4/1985 | Petroff | 364/138 |
| 4,558,430 | 12/1985 | Mogami et al. | 364/900 |
| 4,568,934 | 2/1986 | Allgood | 364/483 |
| 4,595,988 | 6/1986 | Chiffert et al. | 364/483 |

OTHER PUBLICATIONS

Omega Engineering, Inc., "Your Computer Can Now Monitor Temperature Pressure Flow . . . Any Process Signal", (4 pages).

AM2502/3/4, AM25L02/3/4, Intersil, (1 page).
American Aerospace Controls, Inc., Product Listing, Current Voltage & Power Instrumentation, (4 pages).
Trans Data, Inc., Watt Transducers, (6 pages).
Bulletin PC76-1 Ohio Semitronics, Inc., (undated) 2 pages.
TD 1000-B Power Transducers—"A Condensed Guide to RIS Power Transducers, (undated) 4 pages.
TransData Advertisement, Electrical World, Dec. 1983, 1 page.

Primary Examiner—Gary Chin
Assistant Examiner—Daniel W. Juffernbruch
Attorney, Agent, or Firm—Hamilton, Brook, Smith & Reynolds

[57] ABSTRACT

An apparatus and method is provided for monitoring a plurality of analog ac circuits by sampling the voltage and current waveform in each circuit at predetermined intervals, converting the analog current and voltage samples to digital format, storing the digitized current and voltage samples and using the stored digitized current and voltage samples to calculate a variety of electrical parameters; some of which are derived from the stored samples.

The non-derived quantities are repeatedly calculated and stored over many separate cycles then averaged. The derived quantities are then calculated at the end of an averaging period. This produces a more accurate reading, especially when averaging over a period in which the power varies over a wide dynamic range.

Frequency is measured by timing three cycles of the voltage waveform using the upward zero crossover point as a starting point for a digital timer.

22 Claims, 24 Drawing Figures

DETAILED TIMING DIAGRAM

DIGITAL AC MONITOR BLOCK DIAGRAM

DETAILED TIMING DIAGRAM

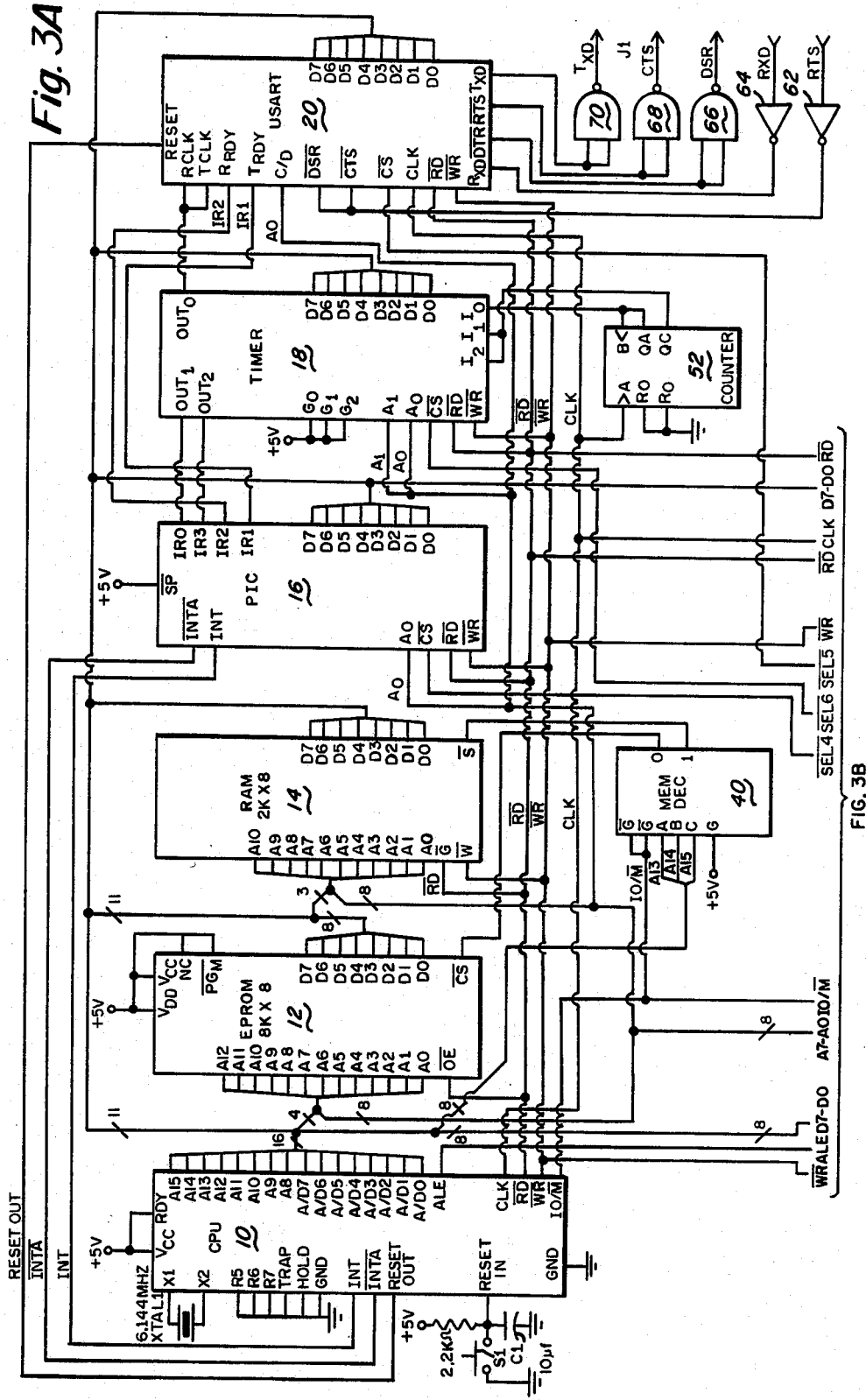

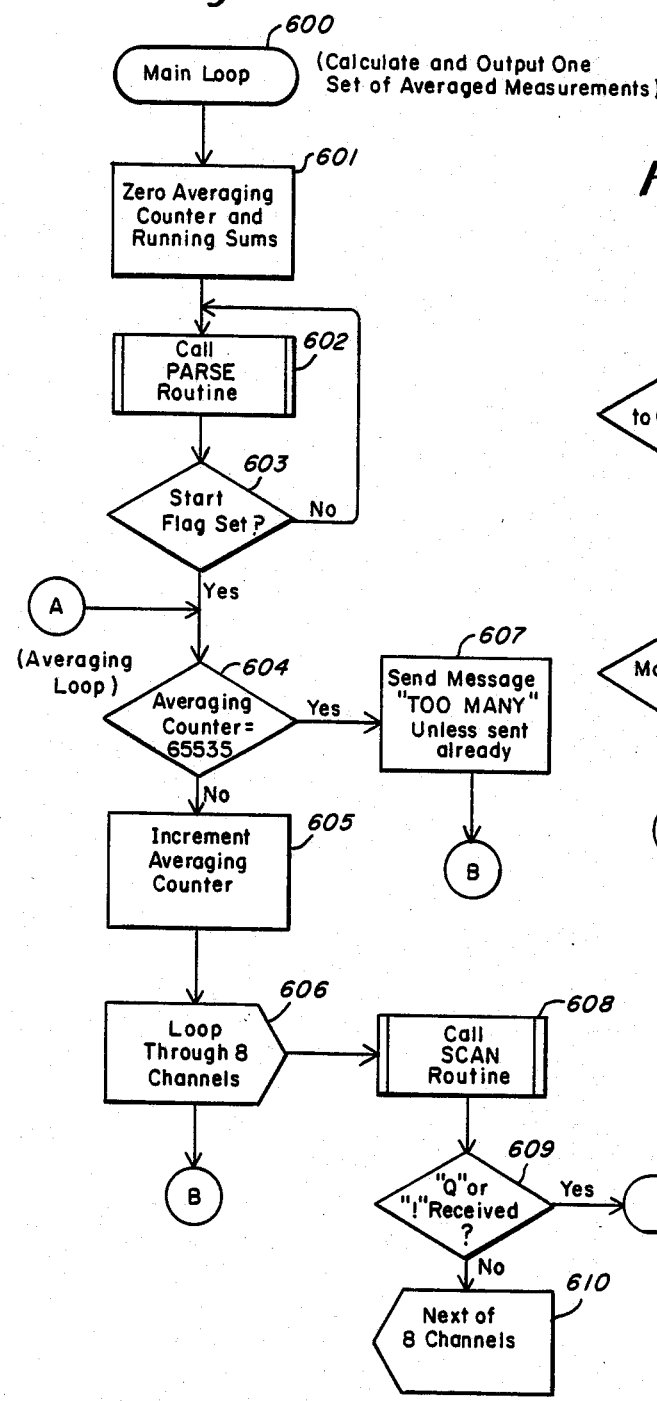
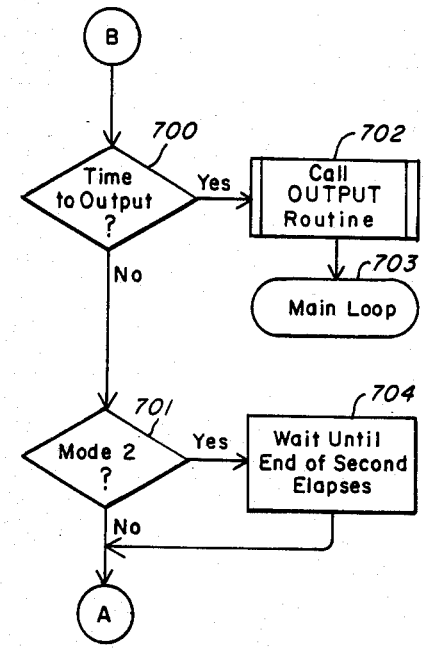

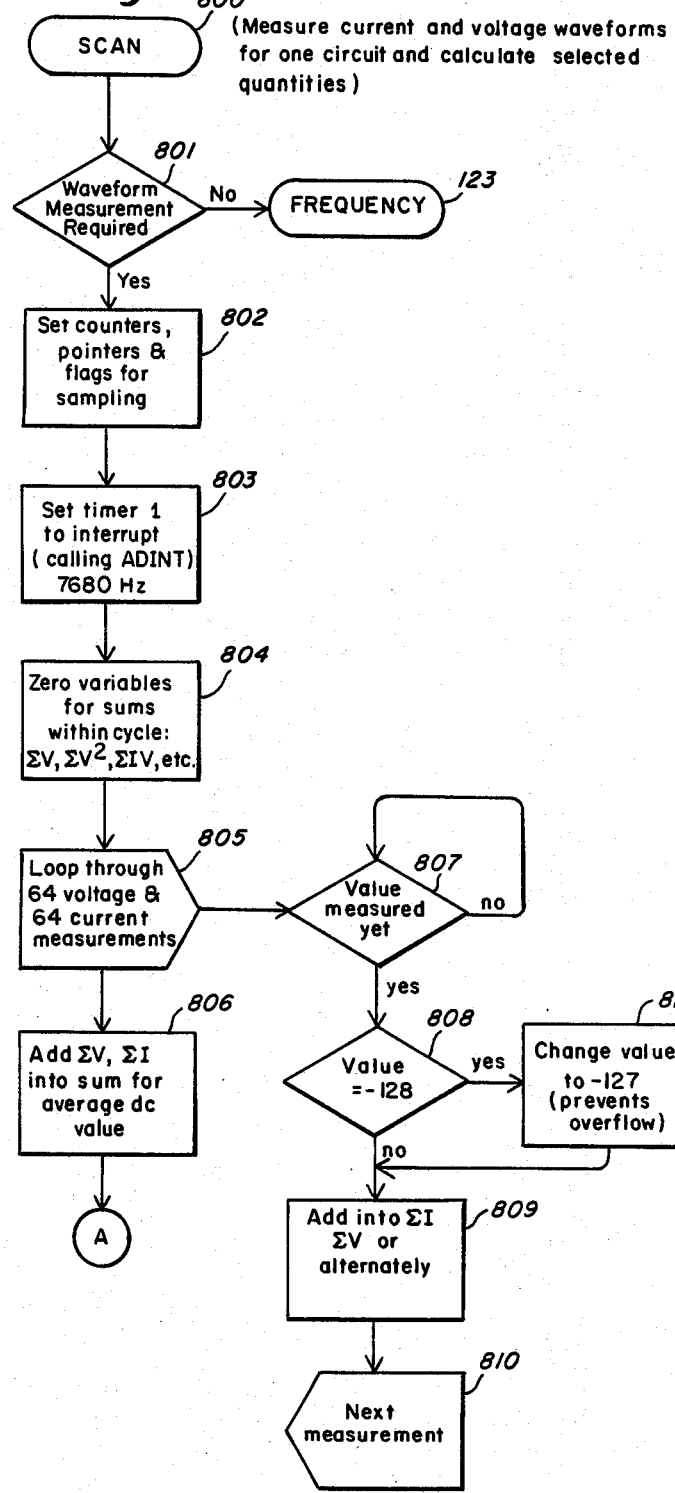
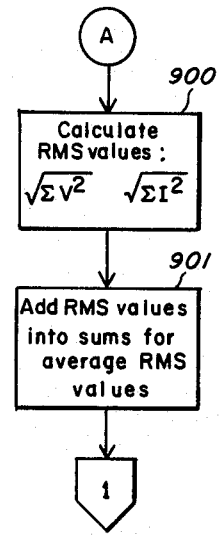
Fig. 8 800 (Measure current and voltage waveforms for one circuit and calculate selected quantities)
Fig. 9

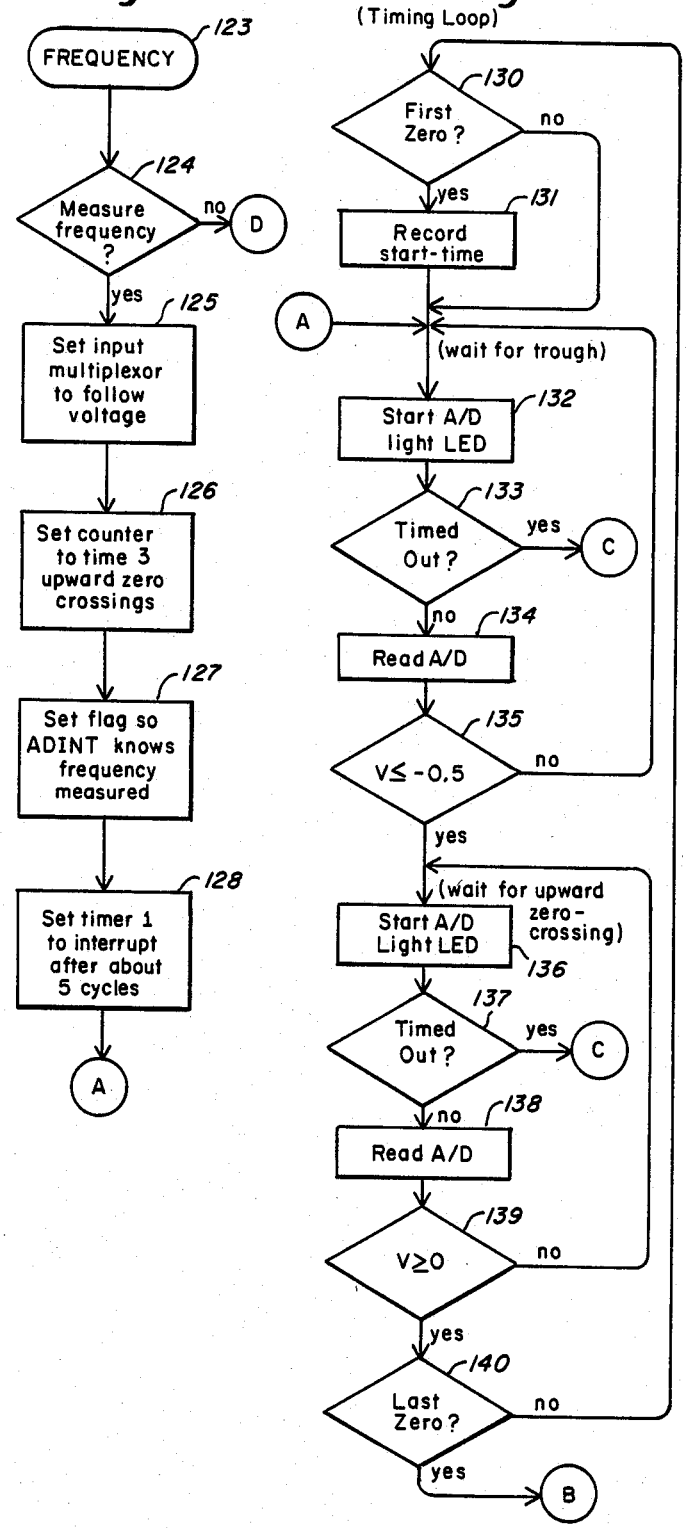
Fig. 12, Fig. 13 (Timing Loop), Fig. 14

DIGITAL AC MONITOR

DESCRIPTION

Government Support

Work described herein was sponsored by the Department of Energy, Contract No. DE-AC02-76ET-20279.

TECHNICAL FIELD

This invention is in the field of electrical power measurement and display.

BACKGROUND ART

Energy in the form of electrical power is a natural resource that must be carefully monitored to determine if it is being effectively generated, distributed and utilized. Presently available devices for measuring the use of electrical power in the main comprise discrete analog transducers which convert ac voltage and current signals from a power system into dc output signals proportional to the true power on the system. Typical utility revenue kilowatt hour (KWH) meters measure power in an analog fashion.

Utilities frequently find it desirable to measure power coming out of a generation on going into a power station. Utilities need to know whether the current and voltage is within certain limits. It is desirable to continuously monitor these factors for statistical use in forecasting for future planning or immediate control of generators and power flows for greater efficiency and safety.

In industrial control applications, it is important to be able to continuously monitor the current and phase of the power into a machine which may vary with the machine load.

Commonly, such transducers measure, at most, the voltage, current, real power and reactive power. Each such transducer costs in the order of $200–$300. A separate transducer is required for each circuit being monitored. Where a number of circuits are being remotely monitored for computer processing and display, the individual transducers must be connected to a data logger or data acquisition device and suitably processed to interface with the computer.

Accordingly, a need exists for a versatile low-cost ac monitor of electrical parameters which can be conveniently interfaced with a computer and can be programmed to continuously monitor and calculate a variety of electrical power factors of a plurality of circuits.

DISCLOSURE OF THE INVENTION

An apparatus and method is provided for monitoring a plurality of analog ac power circuits by sampling the voltage and current in each circuit at predetermined intervals, converting the samples to digital format, storing the digitized samples, and using the digitized current and voltage samples to calculate a variety of electrical power parameters and outputting in a form that can be used by other computers. The current and voltage are sampled at a very high rate (3840 times/second each). This allows the current and voltage waveform to be analyzed digitally. RMS voltage and current, real and reactive power, and other quantities are numerically calculated from the digital waveforms.

In a preferred embodiment, the current I and voltage V are sampled alternately and then the current sample is averaged before and after any specific voltage sample (or vice-versa) to give an accurate measure of the current at the time the voltage was measured without requiring the use of extra hardware. While extra hardware could measure the current at the time the voltage was measured, it would involve additional circuitry and more cost and complexity.

The quantities are repeatedly calculated and stored over many separate cycles then averaged. This produces a more accurate reading because the averaging process has the effect of filtering out noise. Certain derived quantities are then calculated at the end of the averaging period.

Frequency is measured by timing three cycles of the voltage waveform using the zero crossing point as a starting point for a digital timer.

The current and voltage waveforms of each of the plurality of circuits, in the preferred embodiment 8 circuits, are coupled through a multiplexor to the sampling circuitry. Thus, the device is time-shared between each circuit and can perform the calculations for each circuit concurrently within a given time interval.

There is thus provided an extremely flexible device which can monitor multiple ac electric power circuits and determine most parameters of interest such as current, voltage, real power, reactive power, harmonic content, frequency and wave shapes. Moreover, it performs this function at a much reduced cost and more compact size, as compared to known commercial products on the market.

The output of the device is in digital format and can be easily interfaced with a wide variety of other instruments, controllers or recorders which can communicate using standard interfaces including almost every commercially available computer.

BRIEF DESCRIPTION OF THE DRAWINGS

FIGS. 3A and 3B are detailed schematic/block diagrams of the embodiment of FIG. 1.

FIGS. 4–22 are flow diagrams of the steps programmed into the microprocessor hardware of the invention.

BEST MODE OF CARRYING OUT THE INVENTION

A preferred embodiment of the invention will now be described in connection with the drawings. This embodiment has the following capabilities:

1. Continuous substantially simultaneous measurement of up to 8 ac circuits.
2. Measurement of the following circuit parameters: RMS voltage, RMS current, real power, reactive power, apparent power, power factor, frequency, harmonic distortion, load impedance and admittance, dc voltage, dc current. Real and reactive power flows can be separated into flows into or out of a circuit, analogous to ratcheted Kilowatthour and Kilovarhour meters.
3. Any combination of measurements can be taken on any sets of input circuits independently.
4. Programming and output are in ASCII characters over a standard communication line, i.e., one equipped with an RS-232 interface port at speeds from 110 baud up to 19200 baud. Baud rate, parity, stop bits and character echo are switch selectable.
5. Output is directly readable in engineering units (volts, amperes, watts, hertz . . . ).
6. The device can be used as a data logger or test instrument by connecting it with a computer terminal, or it can be used as a sensor peripheral to any computer equipped with a RS-232 port.
7. Supplies digitized current and voltage waveform output showing 64 samples per cycle from which "oscilliscope tracings" of current and voltage waveforms can be reconstructed by the user's software.
8. Outputs can be provided either automatically at intervals, or when polled by the USER.
9. Outputs are provided of either sampled values of the inputs or averaged values over periods from one second up to 18 hours.

GENERAL DESCRIPTION

Figure 1:
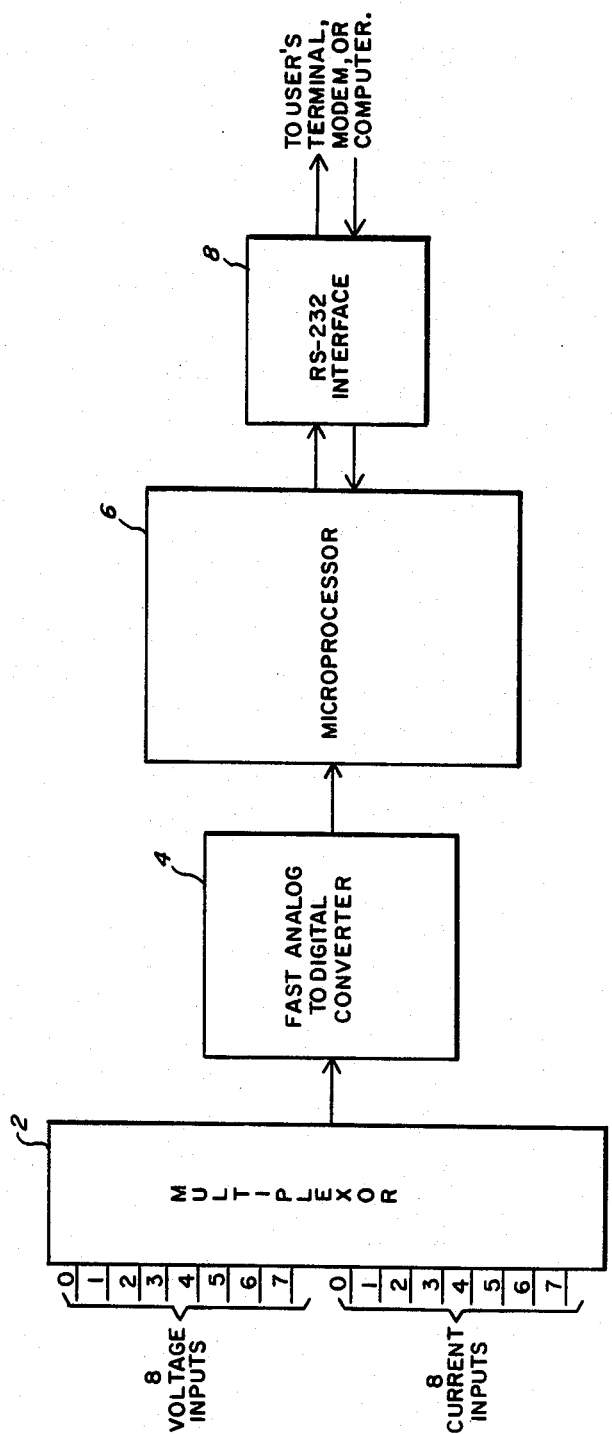
FIG. 1 is a general block diagram of a preferred embodiment of the invention.

As may be seen in FIG. 1, sixteen connection points to respective voltage and current multiplexors 24 and 22 are provided for low level analog inputs. There are eight current and eight voltage inputs each, numbered zero to seven. Although the inputs are labeled "current" and "voltage" to indicate their function in the power calculations, electrically speaking the signals are all voltage signals. The circuit input impedance is greater than one megohm. A zero-centered ac signal of up to ±5 volts peak value should be provided by the USER for the current and voltage of each of the circuits to be measured. The inputs are all referenced to a common ground, so in many applications, voltage transformers must be provided by the USER to generate an isolated input. In certain application, however, the voltage signals can be provided by simple voltage dividers external to the monitor. The current signals can be provided by current transformers with shunts. Many other input sensor arrangements are possible, of course.

In order to obtain power flow measurements with the correct sign, a consistent polarity must be observed when making the voltage and current connections.

The maximum peak voltage which the AC Monitor can accurately read is 4.96 V, and the minimum is −4.96 V. So for accurate readings, the RMS voltage should be kept below 3.5 V RMS. If the signal exceeds this range, but stays within ±10 V, the signal will be interpreted as if it were clipped at ±4.96 V.

The pairing of inputs into voltage and current pairs is only relevant for calculations concerning power. In most respects, all sixteen inputs are equivalent: the AC Monitor apparatus of the invention can be considered as having sixteen ac inputs from which dc voltage, RMS voltage, waveforms and harmonic distortion can be measured. From this point of view, the fact that eight are labeled "I" and eight are labeled "V" is irrelevant. Note, however, that frequency can only be measured at the eight voltage inputs.

The eight voltage inputs and the eight current inputs are fed to a multiplexor 22. The multiplexor samples and switches the 16 parallel input signals to consecutively pass in serial form the input signals selected by microprocessor 6 to an analog to digital (A–D) converter 4 after suitable buffering.

A–D converter 4 converts the analog input signals from the multiplexor to digital signals by a series of successive approximations which are compared to the actual input signal. The answer is stored in a buffer until read out by microprocessor 6.

The microprocessor 6, in accordance with USER commands, controls which inputs are sampled by the MUX's 2 and what calculations are made, in accordance with the instructions it receives from the USER via the RS-232 interface, 8. The calculations are made in accordance with a program stored in the microprocessor 6. The results are transmitted as outputs from the RS-232.

For each circuit for which any measurement commands from the USER are given (other than frequency), the voltage input and the current input are each sampled by multiplexor 2 and connected to digital signals, by A to D converter 4, sixty-four times during a one-sixtieth of a second cycle. The A/D conversion is made alternately between the current and voltage input samples at a rate of 7680 samples (2×64×60) per second. One extra current reading is taken so that there is a current value spaced equally before and after each voltage reading. The digitized values range from −127 to +127.

Figure 23:
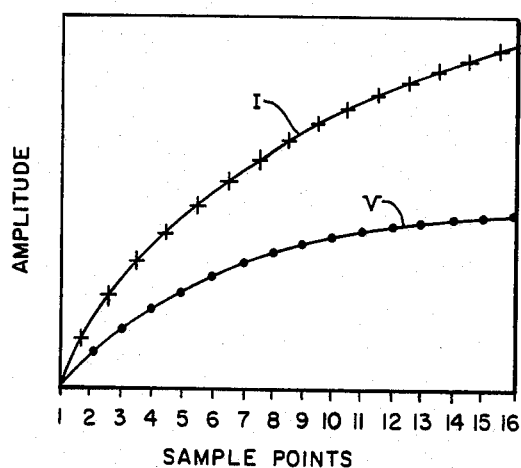
FIG. 23 is a plot of one-fourth of a cycle of amplitude I and voltage V waveforms versus sample points illustrating the alternate sampling concept of the invention.

The above alternate sampling technique may be conveniently illustrated by referring to FIG. 23 which is a plot of one-fourth cycle of a 60 cycle per second current (curve I) and voltage (curve V) waveform. The amplitude of the current and voltage is plotted in the Y-coordinate and the sample points in the X-coordinate. Thus, for a typical U.S. 60 cycle per second waveform, each cycle is 1/60th of a second in duration and ¼ of that waveform is plotted in FIG. 23. As may be seen in curve V, 16 voltage samples are taken during one-fourth cycle. Also, for each voltage sample, a current sample is made half-way before and half-way after a voltage sample. The significance of this procedure will be discussed in more detail in connection with the power measurements of Equation 5, which follows.

Microprocessor Equations

In the formulas below, V and I represent the individual A/D converted values. Note, however, that an A/D reading must be multiplied by a conversion constant, C, to obtain the actual input voltage. For the circuit of the present embodiment, the conversion constant is:

$$C = 5/128 \quad (1)$$

wherein 5=maximum input voltage and 128=maximum A/D converter output.

The dc voltage VD (and current) is calculated by simply averaging the 64 sampled values:

$$VD = \left[ \frac{C}{64} \right] \text{AVG} \{\Sigma V\} \quad (2)$$

The function, AVG {. . .} represents the averaging which occurs between outputs. The part of the computation between the braces is performed repeatedly (as each cycle is measured). When it is time to output results, the average of these computations is determined and multiplied by the conversion constant in the brackets to determine the average dc voltage in units of volts. This value is then converted to decimal and sent to the RS-232 interface for outputting.

The RMS voltage VR is computed as:

$$VR = \left[ \frac{C}{\sqrt{64}} \right] \text{AVG} \left\{ \sqrt{\Sigma V^2} \right\} \tag{3}$$

Note that this results in a true RMS reading, whatever the waveform shape, taking into account thirty harmonics by Nyguist's Rule. The RMS current measurement is similar. It uses only sixty-four of the sixty-five sampled values.

To compute the power, the product of current and voltage is integrated. The current value at a time synchronous with any voltage value can be approximated by averaging the current values immediately preceding the voltage measurement and following the voltage measurement, as shown in FIG. 23. The division by two required in the averaging is factored out so that power PR is computed as:

$$PR = \left[ \frac{C^2}{2 \times 64} \right] \text{AVG} \left\{ \Sigma V_i (I_{i-\frac{1}{2}} + I_{i+\frac{1}{2}}) \right\} \tag{4}$$

Note that in the presence of harmonic distortion this gives the total real power for all frequencies, up to the thirtieth harmonic.

At this point, it may be helpful to refer back to FIG. 23 to illustrate how a partial power calculation for one-fourth cycle is accomplished. Using Equation 4, assume that the ith voltage sample is sample point 5. At this point on the voltage waveform V=6 counts (out of 128). At the $I_{i-\frac{1}{2}}$ sample point (that is the point half-way before the ith voltage sample), the current is 10 counts. The current at the $I_{i+\frac{1}{2}}$ sample point is about 11 counts. Thus, the numerical values (when the ith term=sample point 5) which would be inserted in the summation portion of Equation 4, would be as follows:

$$ith = 5 \; \Sigma V_i (I_{i-\frac{1}{2}} + I_{i+\frac{1}{2}}) = 6 \, (10 + 11)$$

Each of the 64 ith sample points for a full cycle is computed in this fashion and the summation made. The summation is then divided by 2 since current is sampled twice per voltage sample.

Power into a circuit PI is calculated from the real power by treating negative powers as zero. Positive power is defined as a function, f+:

$$f^+(x) = \left\{ \begin{array}{l} x \text{ if } x > 0 \\ 0 \text{ if } x < = 0 \end{array} \right\}$$

Then Power In (PI) is:

$$PI = \text{AVG} \{f^+(PR)\} \tag{5}$$

Power out of a circuit PO is computed at output-time as:

$$PO = PI - PR \tag{6}$$

This gives the same results as if PO were computed by averaging only the negative values of power but it is faster to compute PO this way. If power flows into the circuit during part of the averaging period, and out of the circuit during other parts of the period, the following results hold:

PI>0

PO>0

PR=PI−PO

Reactive power is calculated analogously to real power, integrating the product of the voltage and the current 90°, or in the present embodiment, 16 samples later:

$$RP = \left[ \frac{C^2}{2 \times 64} \right] \text{AVG} \left\{ \Sigma V_i (I_{16+i-\frac{1}{2}} + I_{16+i+\frac{1}{2}}) \right\} \tag{7}$$

where the subscript calculations are performed modulo 64.

Reactive power into, RI, and out RO, of a circuit are completely analogous to real power:

$$RI = \text{AVG}\{f^+(RP)\} \tag{8}$$

$$RO = RI - RP \tag{9}$$

Frequency (FR) is computed by timing three consecutive voltage waveform cycles, starting and stopping at upward zero crossings. If no signal is present, or the signal has too small an amplitude, or if the frequency is out of the 40–80 Hz range, a value of zero is presented at the output.

$$FR = \frac{3}{\text{AVG \{Period of 3 cycles\}}} \tag{10}$$

Total harmonic distortion (THD) of a current or voltage waveform is calculated by first computing the RMS value of the 60 Hz fundamental, $A_{60}$, using Fourier integrals. This RMS value is then subtracted from the RMS value of the waveform, $A_{RMS}$. It is then normalized to the fundamental, and multiplied by 100 to give a percentage. The calculations are equivalent to the following:

$$A_{60}^2 = \frac{2}{64^2} \left[ \left( \Sigma I_i \sin\left(\frac{2\pi i}{64}\right) \right)^2 + \left( \Sigma I_i \cos\left(\frac{2\pi i}{64}\right) \right)^2 \right] \tag{11}$$

$$THD = \text{AVG} \left\{ 100 \sqrt{\frac{A_{RMS}^2 - A_{60}^2}{A_{60}^2}} \right\}$$

Six "derived" quantities are calculated based on the averaged values of RMS voltage, RMS current, real power, and reactive power. The following formulas use the abbreviations given in Table I below:

Apparent power $AP = IR \times VR$ (12)

Power Factor $PF = PR/(IR \times VR)$ (13)

Resistance $ZR = PR/IR^2$ (14)

Reactance $ZX = RP/IR^2$ (15)

Conductance $YG = PR/VR^2$ (16)

Susceptance $YB = -RP/VR^2$ (17)

Note that these formulas are only valid for sinusoidal voltages and currents. In the presence of harmonics, for example, the calculated impedance and admittance may not be reciprocals.

The standard sign convention is followed throughout. An inductive load will consume a positive reactive power, and will have a positive impedance angle. This assumes, of course, that consistent input polarity is observed.

TABLE I

Measurement Summary

| Measurements | Command Characters | Output Units | Derived Quantity | Scale Factor |
|---|---|---|---|---|
| DC Voltage | VD | Volts | no | V |
| DC Current | ID | Amperes | no | I |
| RMS Voltage | VR | Volts | no | V |
| RMS Current | IR | Amperes | no | VI |
| Real Power | PR | Watts | no | VI |
| Real Power Into Circuit | PI | Watts | no | VI |
| Real Power Out of Circuit | PO | Watts | no | VI |
| Reactive Power | RP | Vars | no | VI |
| Reactive Power Into Circuit | RI | Vars | no | VI |
| Reactive Power Out of Circuit | RO | Vars | no | VI |
| Apparent Power | AP | Volt Amperes | YES | VI |
| Power Factor | PF | Dimensionless | YES | none |
| Load Resistance | ZR | Ohms | YES | V/I |
| Load Reactance | ZX | Ohms | YES | V/I |
| Load Conductance | YG | Mhos | YES | I/V |
| Load Susceptance | YB | Mhos | YES | I/V |
| THD of Voltage | VH | Percent | no | none |
| THD of Current | IH | Percent | no | none |
| Frequency | FR | Hertz | no | none |
| Voltage Waveform | VW | Hexadecimal | no | 5V/128 |
| Current Waveform | IW | Hexadecimal | no | 5V/128 |

Timing Diagram

Figure 2:
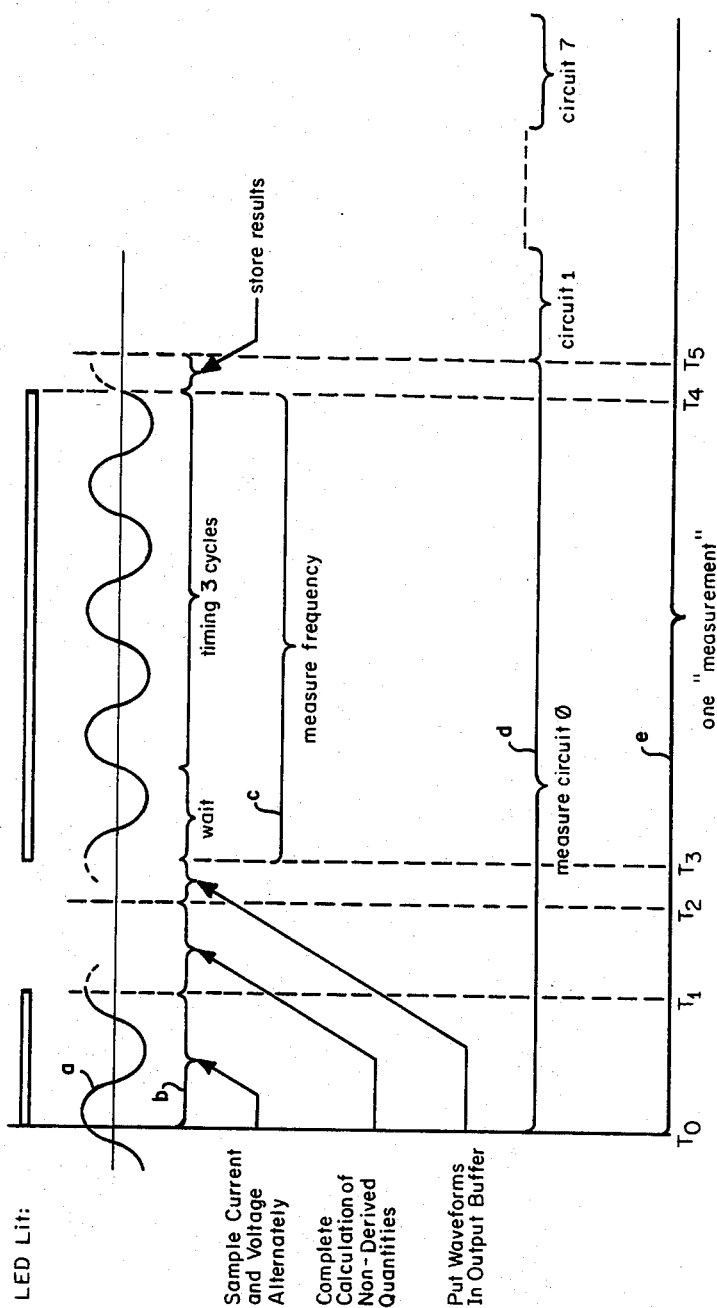
FIG. 2 is a detailed timing diagram of the operation of the embodiment of FIG. 1.

The timing of the AC Monitor is illustrated in FIG. 2 taken with Table II below. FIG. 2 illustrates the manner in which the A/D converter 4 is timeshared between the sixteen input signals. Table II shows timing diagrams on a larger scale than FIG. 2. The entire set of measurements and calculations on eight circuits shown in FIG. 2 is labelled one "measurement" and is represented as one dot, ".", in the timing diagrams of Table II. The exact operation on the larger time scale of Table II depends on the operating mode, as will later be described in detail in connection with the flow charts of FIGS. 4–22. The detailed timing of FIG. 2 depends on which measurement commands are selected by the USER.

Note the distinction between derived and nonderived measurements listed in Table I. Only the non-derived quantities are calculated repeatedly over separate cycles. These individual readings are then averaged to give the quantity which is output at the end of the averaging period. FIG. 2 shows the details of only the non-derived quantities.

The derived quantities are calculated only at the end of the averaging period (the ";" of Table II), based on the non-derived quantities. For example, the resistance output, a derived quantity, is not the average resistance, but rather the resistance which would produce the average power flow given the average current, in accordance with Equation 14, page 12. The difference between these two methods can be significant when averaging over a period in which the signal shows a wide dynamic range.

FIG. 2 shows the measurements of one circuit in detail. Sampling of a given circuit occurs if any measurement other than frequency is selected by the USER for that circuit. Curve "a" shows a plot of a possible amplitude versus time waveform of the analog circuit voltage or current input signal. Curve "b" shows the interval $T_o-T_i$ during which the sampled voltage and current are measured alternately and stored. These measurements are equally spaced over one-sixtieth of a second, so erroneous results will be calculated if the frequency differs significantly from 60 Hz. In other words, this implementation is designed for 60 Hz power which is used throughout the United States. A slight modification of the program would make the device suitable for 50 Hz power used in Europe. As the bar at the top of FIG. 2 indicates, an LED is lit during the sampling process. Non-derived quantities such as DC and RMS voltage and current are also calculated during the period $T_0-T_1$, in the background as time permits between samples.

During period $T_1-T_2$, calculation of the nonderived quantities is completed. The length of this period $T_1-T_2$ is variable and depends on which measurements were selected. After period $T_1-T_2$, if certain criteria are met, waveforms may be outputted during the period $T_2-T_3$. There can be a long delay at this point if the AC Monitor's output buffer is still in use from a previous output. The exact delay depends on what remains to be transmitted, and on the baud rate. When there is room, the waveforms are placed in the output buffer during time period $T_2-T_3$ and measurements continue.

Frequency is the last item measured if it has been selected for measurement by the USER. Three cycles are timed during the period $T_3-T_4$. This measurement is preceded by up to a sixtieth of a second of delay (labelled WAIT), waiting for an upward zero crossing. When a frequency measurement begins, a timer is started so that should no waveform be present, the AC Monitor will only spend up to four-sixtieths of a second looking for the four sequential upward zero crossings.

Finally the results are stored during period $T_4-T_5$. The stored results are added into running sums from which averages are later calculated.

As shown in curve "d", the entire process is then repeated for the remaining seven circuits. The entire set of eight circuits constitutes one "maasurement" (shown as one ".") in Table II. The AC Monitor will repeat these measurements immediately if in the standard mode (mode 1), or at the end of one second if in the one second sampling mode (mode 2). It continues doing this until the time comes to output results. At that time, the average of all the measurements is calculated and outputted.

TABLE II

OPERATING MODES

| Mode | Averaging? | Sampling (1) Interval | Timing Diagram (3a) (Polled Mode) | Timing Diagram (3b) (Auto Mode) |
|---|---|---|---|---|
| 1 | yes | asap (2) | S.....S;..........S;... | S........;..........;.. |
| 2 | yes | 1 second | S...S;.....S;. | S....;....;.. |
| 3 | no | at output interval (3) | S; S; S; | S; ; ; |
| 4 | no | asap (2) | S;;;;;;;;;;;;;;;;; | S;;;;;;;;;;;;;;;;; |

Applications
Mode 1 Suitable for most applications. Default on start-up and after "!".
Mode 2 Necessary for long time intervals.
Mode 3 Use if measuring only waveforms, or for samples rather than averages.
Mode 4 Used for dumping waveforms and/or samples as fast as possible.
Notes:
(1) Sampling interval may be slowed by speed of communications, especially at low baud rates or if waveforms are dumped.
(2) As soon as possible. The more measurements programmed, the more time will be required.
(3) Output interval is determined by:
(a) When "S" is received, if in polled mode (nnnnnT not programmed). Time between S's is determined by user's equipment.
(b) Every nnnnn seconds, if in auto mode (given by nnnnnT command).
Key to Timing Diagrams:
S = S received
. = one "measurement" taken and incorporated into average
; = like "." but in addition waveforms dumped, derived quantities calculated, and average values output
... = sampling as soon as possible (asap)
. . . = 1 second sampling

Operating Modes

As shown in Table II, the AC Monitor can be programmed to operate in eight distinct modes which determine the sampling and output timing, and the source of timing control. The eight modes result from the independent selection of one of four modes which determine sampling and output timing (MD command), with one of two modes which determines the source of timing control (T command).

The "T" command determines whether the user's computer will poll the AC Monitor every time output is required (polled mode), or whether the AC Monitor should automatically output at regular intervals (auto mode). Polled mode is the mode the monitor reverts to if no other "T" command is given, i.e, the "default" mode on start-up. When the monitor is reset by a "!" command, the device also enters polled mode. Polled mode can also be entered by giving a "T" command with a time of zero seconds, or by omitting any time specification in the "T" command (e.g., "0T" or "T"). In polled mode the USER (or, more likely, the user's computer) must send an "S" every time output is desired. Note that this need not be at regular intervals.

Auto mode is entered by programming a non-zero time interval (e.g., "120T"). The time interval can range from one to 65535 seconds. In auto mode a single "S" command suffices to start output. A "Q" (or "!") can later be sent to stop the output if desired.

The "MD" command allows for four modes (numbered 1-4) which determine what averaging, if any, is involved in the output values. When the AC Monitor is turned on, or when a "!" is received, it is placed in mode 1.

The four different modes of sampling and output timing will now be described in detail:

(Mode 1)

Mode 1, as previously noted, is the mode of operation by default if no mode command is given. Mode 1 is satisfactory for most measurement applications with reasonably short periods between outputs. In Mode 1 the various measurements which the USER has programmed are repeated over and over again during the interval between outputs. When the time comes to output (because an "S" was received if in the polled mode; or because n seconds elapsed if in auto mode) the average of all the intervening measurements is outputted. This mode comes close to giving the true average because the A/D converter is time shared between the eight circuits. For example, if VR0, VR1 and VR2 (the RMS voltage for circuits 0, 1 and 2) are selected, each of the three output values is the true average over a set of cycles that cover almost one-third of the time between outputs.

(Mode 2)

Mode 2 slows the sampling to once per second, which allows long time intervals, at the cost of perhaps missing some of the dynamics of the signal if it changes rapidly during the portion of each second that the AC Monitor remains idle.

(Mode 3)

In mode 3, samples, rather than averages, are outputted. If the monitor is used only to collect waveforms, and not to compute any averaged values, mode 3 is used. Mode 3 can also be used with non-waveform measurements where the sampled value at a time immediately preceding output is desired.

(Mode 4)

Mode 4 is a free running mode used for outputting waveforms and sampled values, as quickly as possible. In mode 4, the measurements are taken and outputted repeatedly, as quickly as possible, limited only by the speed of the microprocessor and the communications line.

System Description

Referring now to the circuit diagram of FIGS. 3A and 3B, the AC Monitor circuit will be described before referring to the flow diagrams which follow.

The heart of the AC Monitor is the central processing unit 10 which may be, for example, an INTEL I8085 microprocessor. The microprocessor 10 is programmed from a computer program stored in EPROM 12. EPROM 12 may comprise an INTEL I2764 commercially available EPROM which stores the operation program in binary machine language. EPROM 12 has 8,000 eight-bit bytes of memory. RAM 14 is used by CPU 10 to store calculations and data and has 2,000 eight-bit bytes of memory capacity. Crystal XTAL 1 is a 6.144 Mhz microprocessor unit clock crystal which provides precise timing signals for the microprocessor unit 10 to serve as the internal clock for the CPU 10.

CPU 10 operates in real time to perform a variety of functions. To enable it to allocate priorities to certain functions, programmable interrupt controller (PIC) 16, which may comprise an INTEL I8259 unit, is provided as an accessory to the CPU 10 to interrupt certain calculations which are then placed in storage in RAM 14 to permit higher priority computations or processes to proceed in real time.

Multipurpose timer 18 which may comprise an INTEL 8253 programmable timer provides three different clock pulses based on the crystal-generated clock coming from the CPU 10 over the line designated CLK. One set of clock pulses from timer 18 control the time of taking measurements. This clock pulse at OUT 1 lead is connected to the interrupt controller 16 on lead IR∅. A second timer clock pulse is used to time the rate at which the results are provided from the AC Monitor. This clock pulse is provided at OUT 2 to IR 3 at PIC 16. Finally, there is a third set of clock pulses that is used in communications for timing the transmit and receipt of the individual bits of information from a host computer or teletype. This timer has eight different rates and is provided over line OUT ∅ of timer 18.

Additionally, there is a universal synchronous/asynchronous receiver transmitter (USART) 20 which is used in the asynchronous mode to interface between the microprocessor and the host terminal or computer which is communicating with the AC Monitor.

Level shifters 62, 64, 66, 68 and 70 are provided between the USART 20 and the input/output jack J1 to the AC Monitor from the host computer. These level shifters are required to interface the AC Monitor circuit which operates on a 5 volt level with an international standard for interfacing with a computer which is the RS232 standard of a 15 volt level. The level shifters convert 5 volts to 15 or vice versa for the receiving lines labelled RXD and RTS, which stand respectively for "received data", and "ready to send" and the transmitting lines labelled TXD, CTS and DSR which stand respectively for "transmitted data", "clear to send", and "data set ready".

Counter 52 divides the clock pulses from the CPU clock crystal 1 into suitable timing signals which timer 18 uses to generate the timing signals for the overall operation of the AC Monitor.

Decoder 40 provides the interface between the microprocessor and the memory units. Decoder 38 of FIG. 3B is the input/output decoder. The input/output decoder interfaces the timer, the program interrupt control, and the USART and the address latch, to the microprocessor.

A series of switches 72 are provided which must be set by the USER in accordance with the parameters of communication between the AC Monitor and the particular RS2332 interface standard utilized by the host computer in commication. Table III below provides a summary of the switch settings.

TABLE III

| Switch Settings | |
|---|---|
| Switch | Function if Switch in "OPEN" Position |
| SW1 | Self-Test Mode |
| SW2 | |
| SW3 | } Baud Rate (see below, where 1=OPEN) |
| SW4 | |

TABLE III-continued

| Switch Settings | | | |
|---|---|---|---|
| SW5 | Parity Enable | | |
| SW6 | Even Parity | | |
| SW7 | Echo of Input Characters | | |
| SW8 | Second Stop Bit | | |
| Baud Rate | S2 | S3 | S4 |
| 110 | 0 | 0 | 0 |
| 300 | 1 | 0 | 0 |
| 1200 | 0 | 1 | 0 |
| 1800 | 1 | 1 | 0 |
| 2400 | 0 | 0 | 1 |
| 4800 | 1 | 0 | 1 |
| 9600 | 0 | 1 | 1 |
| 19200 | 1 | 1 | 1 |

Switch monitor 58 is a switch input port device. The switch monitor enables the CPU 10 via the program interrupt controller 16 to monitor the switch positions or settings every 10th of a second for changes. The functions of the eight switches comprising input switch 72 are designated below. Note that as explained in connection with the flow chart of FIG. 20, if a character is received with a parity or baud rate not agreeing with a particular switch position, the microprocessor is programmed to ignore such a character and an error message ["COMMUNICATIONS"] is transmitted back to the host computer.

SW1—Setting switch 1 places the AC Monitor in test mode. The switch must be "off" for normal operation.

SW2,SW3,—These three switches are used to select
SW4—one of eight possible baud rates, from 110 to 19200. The switch positions and baud rates are listed in Table III.

SW5—Switch 5 enables parity. It must be on for SW6 to have the behavior described below. If SW5 is "off", parity is not transmitted or expected.

SW6—If parity has been enabled (via SW5), this switch determines whether even or odd parity is transmitted and expected. If set, the AC Monitor treats incoming characters as errors if they are not terminated with an even parity bit. When set, all transmitted characters are followed by an even parity bit. When switch 6 is off the behavior is analogous, but with odd parity.

SW7—If switch 7 is on, the AC Monitor echoes characters sent to it. This may be desirable if it is being used with a terminal as a data logger. For use as a peripheral to a computer, the switch will be set "off" in most cases.

SW8—Switch eight determines whether one or two stop bits are transmitted. If the switch is "off", one stop bit is transmitted after each character. If the switch is "on", two stop bits are sent. (Most modern devices need only one.) The AC Monitor only requires one stop bit to be sent by the USER device, regardless of which position this switch is in.

Switch SW1 places the monitor in the self-test mode. This allows the USER to test the AC Monitor and a communications line prior to actual use. If everything is operating properly, diagnostic light-emitting diode 74 blinks alternately for one second On and one second Off.

Timer 60 is a one-shot multivibrator which provides the appropriate time intervals to maintain the LED operative. If the AC Monitor is operating properly but cannot output data because it is not receiving an appropriate data terminal ready (DTR) indication from the user's equipment, the LED is blinked several times per second as long as switch 1 remains in the On position. If the LED remains Off when switch 1 is in the On position, the AC Monitor is not operating properly. If the LED remains On, the self-test has failed and the monitor needs repair. The self-test does not test the accuracy of the A-D conversion, it only verifies that the major hardware components are operating.

The address latch 32 stores eight bits of the address bus for use by many of the circuit components.

Multiplexers 22 and 24 sample the input current and voltage signals 64 times every 1/60th of a second and couples such samples through buffer circuit 28 to an A-D converter made up of items 42 through 50. A multiplexor latch 26 is connected with the multiplexor units 22 and 24 to enable the microprocessor to select inputs for measurement at certain intervals of time dictated by the microprocessor unit 10. The A-D converter consists of an A-D input port 46; a successive approximation register 42, and a D-A converter 44. Through a series of successive approximations, this circuit converts the analog signals from multiplexors 22 and 24 to digital signals proportional to the instantaneous sampled analog voltages or currents.

A-D input port 46 stores the digital signal for transmitted at the appropriate time to the CPU 10. A reference voltage for the A-D conversion is provided by reference source 51. Source 51 is a precise voltage reference which can be calibrated by adjusting potentiometer R3. An external lead labelled VREF is provided for extracting the voltage reference signal through a voltage divider circuit comprising resistor R1 and R2 to provide an external check of the voltage reference for calibration purposes.

Programming Description

The AC Monitor is programmed with simple mnemonic commands sent over the RS-232 line, i.e., J1 lines labelled TXD, RXD, RTS, CTS and DSR in FIG. 3A. The following commands are recognized by the AC Monitor:

!—An exclamation point is used to initialize the monitor and reset the software to its start-up state.

?—A question mark causes the AC Monitor to respond with a one line header containing a software version number.

nnnnnT—A "T" (for "Time") preceded by up to five digits, sets up an interval time in seconds between outputs. This command places the AC Monitor in the mode in which it outputs automatically at intervals. The maximum time allowed is 65535 seconds (over 18 hours). If no digits or a time of zero seconds is given, the program reverts to the mode of sending data only when polled. (This mode is default on start-up and after a "!" command.) Leading zeros, if provided, are ignored.

S—The "S" command (Start Sampling and Sending) causes the AC Monitor to take measurements and output them. If the user's computer is to poll the AC Monitor, it should be programmed to send an "S" every time it wants a reading. If a non-zero time-interval command is given, then a single "S" causes automatic outputs at the specified interval. If no time interval command is given (or a time interval of zero seconds) then the first "S" starts the monitor averaging. Subsequent "S"s cause the monitor to send out the results up to that point and start averaging again.

Q—The "Q" command (for "Quit") causes the AC Monitor to stop averaging and sending data at intervals. The "Q" command, unlike the "!" command, does not reset the program to its initial state. Automatic output can be resumed with a subsequent "S" command. Between the "Q" and the "S" other commands can be given to change the interval time or add additional measurements. (A "Q" is also be used to terminate and cancel a multicharacter command which was mistyped.)

MDm—"MD" followed by a single digit specifies one of the four operating modes. The digit (m) can be 1, 2, 3, or 4. The modes determine how often measurements are sampled, averaged and outputted. If no mode command is given, the monitor defaults to mode 1.

—The "#" command causes the AC Monitor to print out the number of measurements that are averaged together to generate one reading. This can be useful when selecting an operating mode. It can also be used for computing weighted averages when polling at irregular intervals.

*—The asterisk command causes the AC Monitor to output an asterisk at the end of every set of measurements. This can be useful when writing a program to communicate with the AC Monitor. The user's program can request data and then accumulate incoming characters until an asterisk is received. At that point, the computer now knows that a complete string has been received and can be processed.

There are 168 possible measurement commands which can be implemented in any combination. Each command specifies one of twenty-one possible measurements on one of eight possible input circuits. Measurement commands consist of three characters (e.g., "VD0"). The first two characters indicate which measurement is to be taken (e.g., voltage, power, frequency, etc.). The third indicates which of the eight circuits it should be taken on (a digit from 0 to 7). The measurement characters can be any of the following:

VD—DC voltage
ID—DC current
VR—RMS voltage
IR—RMS current
PR—real Power
PI—real Power Into circuit (ratcheted KWH meter)
PO—real Power Out of circuit (ratcheted KWH meter)
RP—Reactive Power
RI—Reactive power Into circuit (ratcheted KVARH meter)
RO—Reactive power Out of circuit (ratcheted KVARH meter)
AP—apparent power
PF—power factor
ZR—resistance of load (real part of impedance)
ZX—reactance of load (imaginary part of impedance)
YG—conductance of load (real part of admittance)
YB—susceptance of load (imaginary part of admittance)
VH—total Harmonic distortion of voltage signal
IH—total Harmonic distortion of current signal
FR—frequency
VW—waveform dump of voltage
IW—waveform dump of current Measurement commands can be given in any order and repeated any number of times. They have a cumulative effect until a "!" is received, at which point they are all "forgotten." Time interval and mode commands can be given at any point. Only the most recently given time interval and mode commands are effective. Spaces, carriage returns and line feeds may be used (but are not required) to separate commands, but may not appear within a multi-character command.

An error message "(SYNTAX)" is transmitted if the syntax is violated. This occurs, for example, if one of the measurement specifiers is not immediately followed by a digit from 0 to 7, or if any unrecognized character (such as a lower case letter instead of a capital) is received. If an error occurs during a multi-character command, it must be restarted from its first character.

An example of a typical program command is the following character sequence:

! 60T VR1 IR1 PR1 FR7 VR3 S

This sequence can be used to start output of the RMS voltage (VR), current (IR) and real power (PR) of circuit one, the voltage of circuit three (VR3), and the frequency of circuit seven (FR7), at one-minute intervals (60T). Any previous program is erased by the "!" command. Note that mode one (MD1) is entered by default. At a later time, the sequence:

Q IR3 120T S will cause the current of circuit 3 (IR3) to be included, and slow the time interval to two minutes (120T). The "Q" is necessary if this command is to have immediate effect. When the AC Monitor is in the process of averaging data, as it is in this example, it can not accept additional measurements immediately. Instead, it buffers the incoming characters until the averaging in progress is complete. The buffered commands are incorporated into the program at the beginning of the next averaging period. The "Q" causes the AC Monitor to stop averaging so that the incoming characters are processed immediately.

Output Format

Output is in a fixed sequence regardless of the order of measurement commands, as follows:

(A) Waveform dumps precede all other outputs. Waveforms for circuit zero are first, circuit seven last. If both are selected for a circuit, the voltage waveform precedes the current waveform.

In order to minimize transfer time, a hexadecimal format is used for waveform dumps. Each waveform output begins with the three-character command which caused it, as an identifier (e.g., "VW0"). The waveform is followed by a carriage return and line feed. The waveform is coded as a sequence of sixty-four eight-bit values spaced evenly over one 60 Hz cycle. Each value is sent as two ASCII characters, preceded by a space. The two characters are a hexadecimal representation of the two's complement value of the voltage at the analog input terminal. The value is scaled linearly so that a byte value between −128 and +128 represents a voltage between −5 and +5 volts at the analog inputs. The extreme values (−128 and +128) never occur. As an example, the characters "FF 0A" as part of a waveform, represent the values −1 and 10 which correspond to −0.039 and 0.39 volts at the input terminal.

(B) If the "#" command has been given, the number of samples averaged is outputted on a separate line, preceded by a number sign and a space.

(C) Measurements follow all waveforms. Measurements of circuit zero are first, circuit seven last. If several measurements are selected for a circuit, the output comes in the sequence given in Table 1.

Each measurement is preceded by the three-character command which caused it. The value consists of either five digits or four digits with a floating decimal point. It is preceded by a space or a minus sign according to its sign. (Some of the quantities can only be positive.) The value is followed by a space. The outputs for each circuit appear on a separate line. The following example is a possible output to the above programming example:

VR1 3.001 IR1 2.998 PR1 −8.992

VR3 0.123 IR3 0.002

FR7 59.98

Error Messages

The error messages that the AC Monitor can transmit are listed and explained below. All error messages begin with a left parenthesis and end with a right parenthesis followed by a carriage return and line feed.

(SYNTAX)—This message indicates the programming format was violated or an unrecognized character was received.

(RANGE)—A number out of range will generate this error. An example would be a circuit other than 0–7, or an interval time other than 0–65535 seconds or a mode other than 1–4.

(COMMUNICATIONS—This message indicates that a character was received from the user's equipment with the incorrect parity or at the incorrect baud rate. This message is likely to be received in garbled form if the baud rate is incorrect.

(TOO LONG)—This message is sent out if the USER has allowed averaging to go on for too long a period. The results that are outputted will be the average only up to the time when this message is received.

Flow Chart

Figure 4:
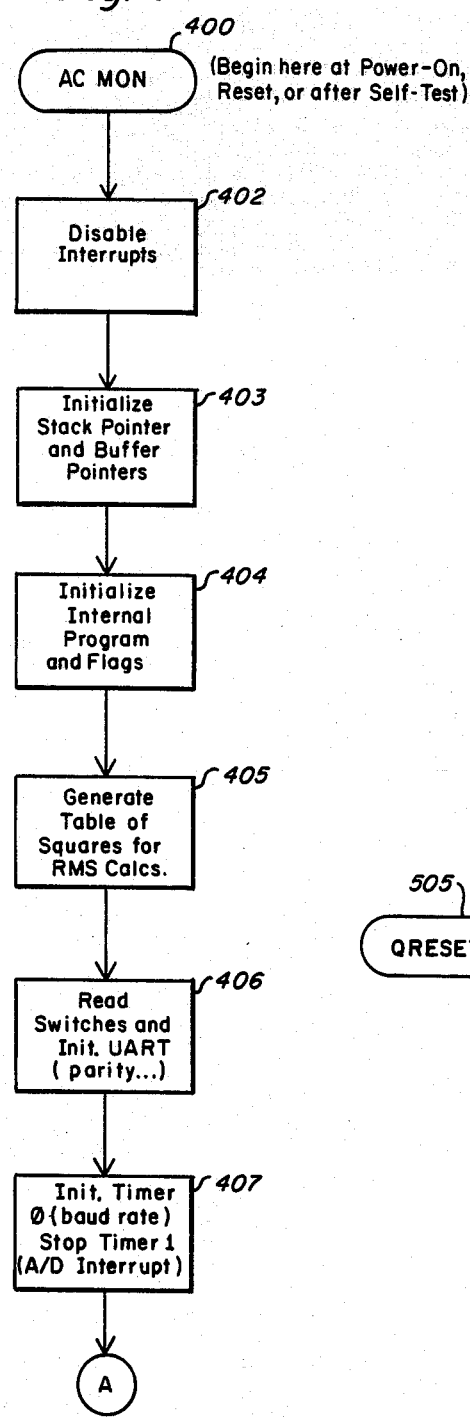
Figure 5:
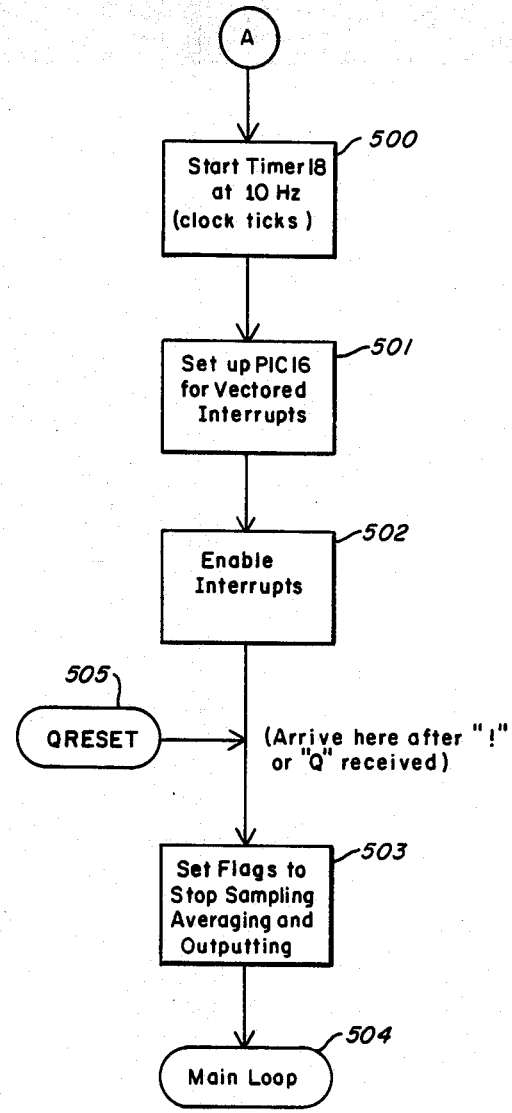

The program stored in the EPROM for the AC Monitor CPU will now be described in connection with the flow charts of FIGS. 4–22. Certain conventions are used in these charts, as follows:

(1) Oval boxes, such as 400 FIG. 4, indicate a main part of the program.

(2) A rectangle, such as 402, is a predetermined process to be accomplished by the CPU. Some such processes may involve as little as one line of code. Others might be several pages of code in the program.

(3) Circles with letters show connections between adjacent figures.

Figure 10:
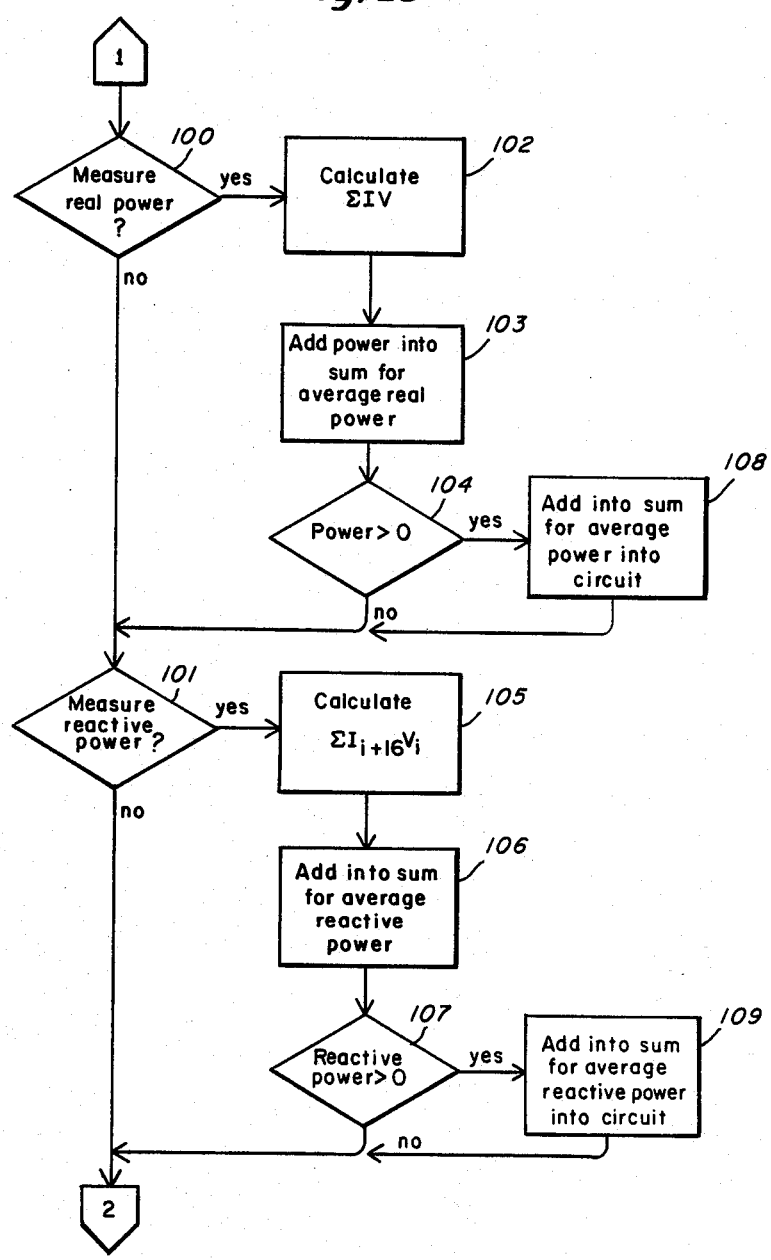

(4) A 5-sided box with a number in it, such as shown in FIGS. 9 and 10 shows the connections to non-adjacent figures.

(5) A diamond (FIG. 6 603) is a decision point in the program.

(6) A box with horizontal lines on the sides indicates a sub-routine (FIG. 6 602 and 608).

(7) A 5-sided box with an angle which points to the right (FIG. 6 606) indicates that the section that follows in the direction of the point is repeated a certain number of times; each time varying a parameter, until completed and then the microprocessor proceeds to the next step.

(8) A 5-sided box which points to the left (FIG. 6 610) indicates the end of the repeated section.

Figure 20:
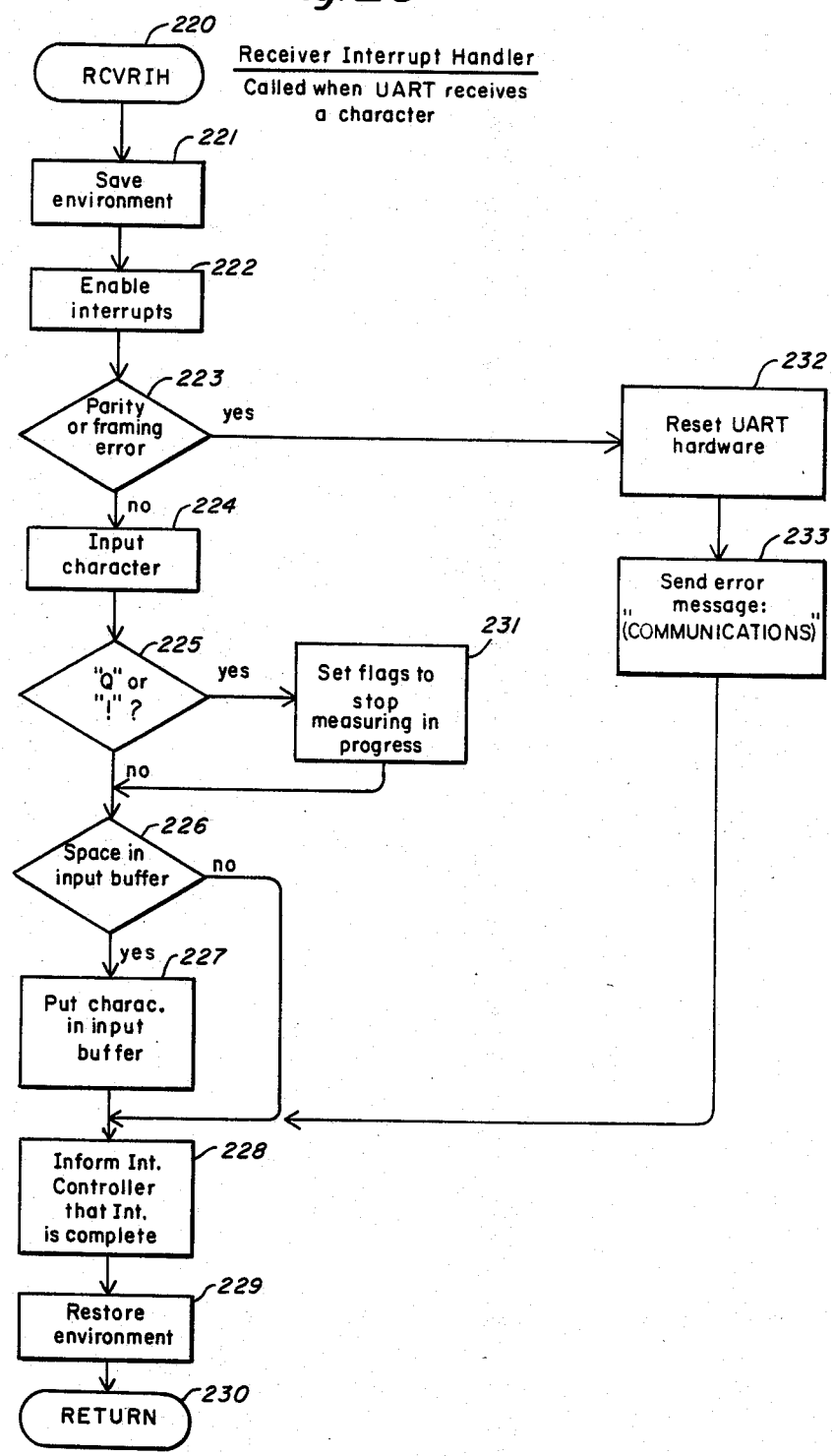
Figure 21:
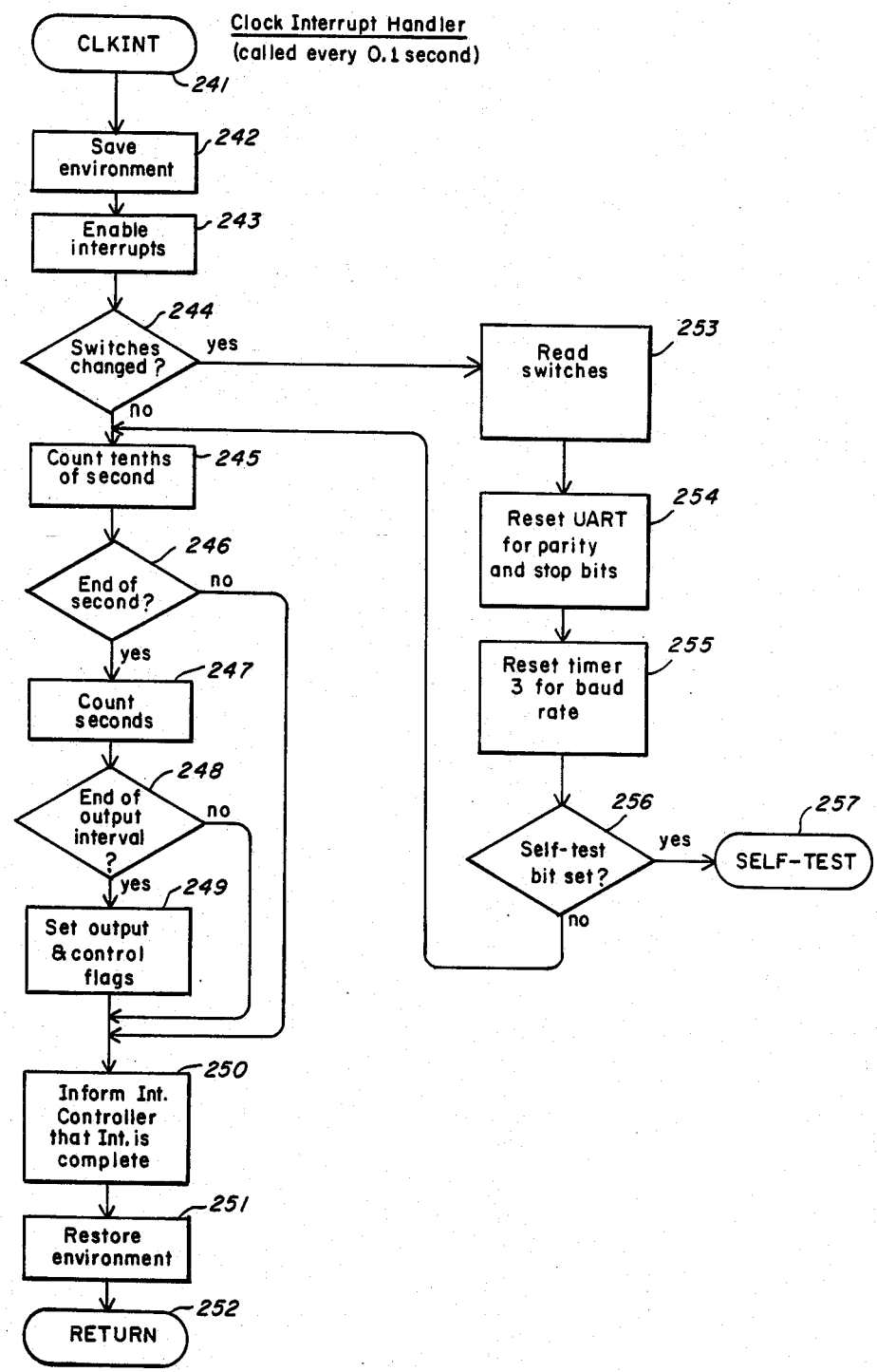

The entire program consists of a main program shown in FIGS. 4–27 and four separate programs which are allowed to run based on a priority schedule implemented by the PIC 16 of FIG. 3A. The main program proceeds until interrupted for one of the four sub-processes. These four sub-processes, in order of priority are A/D Interrupt or ADINT (FIG. 18), Transmit Character Interrupt Handler XMITH (FIG. 19), Receiver Interrupt Handler RCVRITH (FIG. 20) and Clock Interrupt Handler CLKINT (FIG. 21).

Main Program

The main program commences by commanding the CPU 10 FIG. 1 to disable interrupts 402 which stops any other process from running until the CPU sets the system for the processes. This step is commenced by turning on power to the monitor or pressing the reset button S1 FIG. 3A.

Next, stack and buffer pointers are set (403), to keep track of where certain data is stored in memory. Next, internal programs and flags are set (404). The CPU is instructed to generate a table of squares to be used for RMS calculations (405). The CPU squares all the 256 possible numbers that might be needed in computing RMS values and stores them in a look-up table in RAM 14. The CPU is then able to address the look-up table later and obtain the answer as it needs it. This enables the AC Monitor to calculate much faster than otherwise.

Figure 3B:
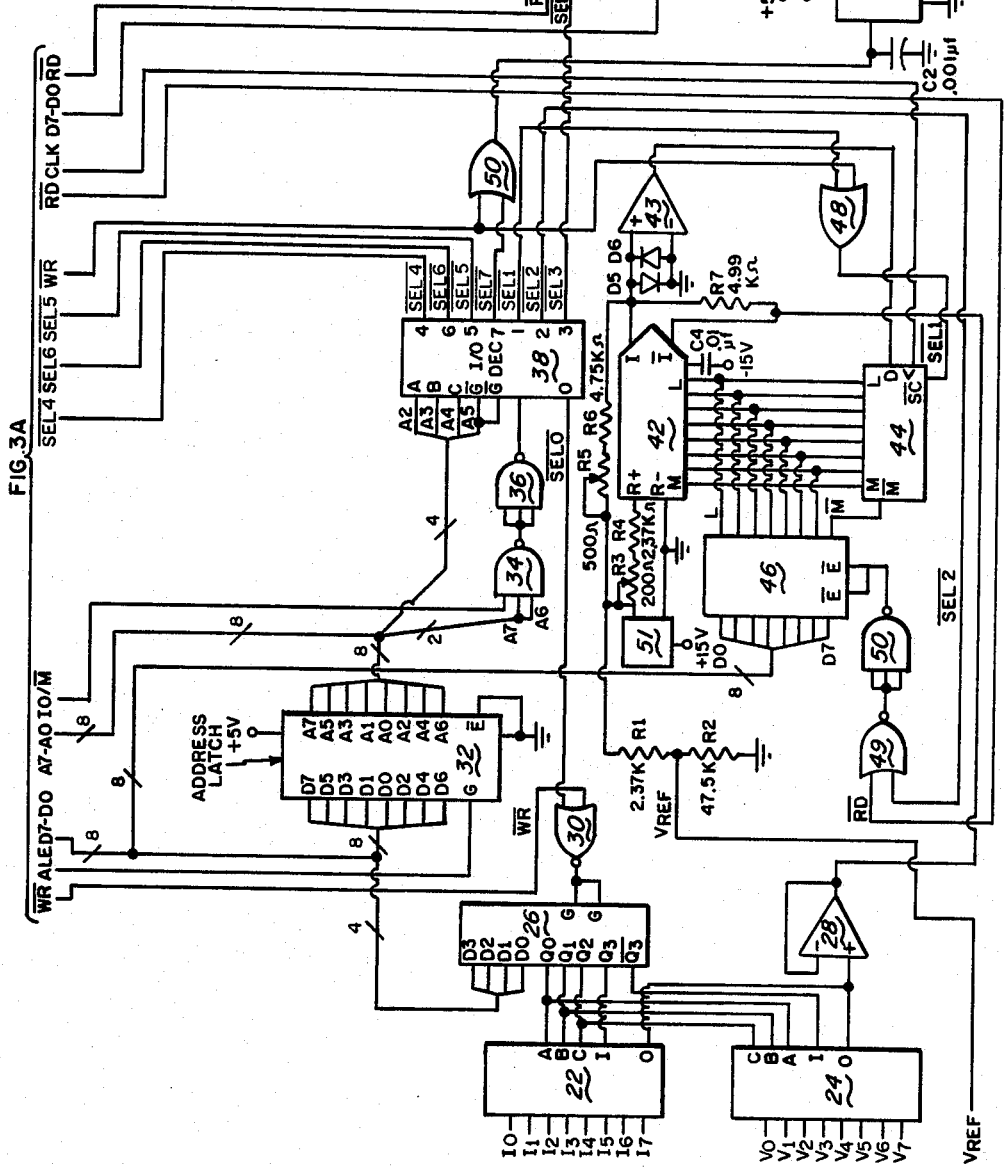

Next, the CPU is instructed to read the switches 72 FIG. 3B used for establishing the baud rate for communication. The monitor can communicate at rates ranging from 110 bits per second (110 baud), equivalent to 10 characters per second, up to 19,200 bits per second. The CPU reads the switch position and based on the switch position, locates timing data corresponding to that speed in a table in EPROM 12 FIG. 3A. It then instructs the USART 20 by commanding timer 18 to set the clock speed accordingly.

Another parameter that the switches 72 establish is "parity", i.e., whether there is an even or odd parity. This is part of the communications protocol which helps to correct communication errors. If there is an error in the transmission, it can be detected by using a parity bit. Thus, by setting the switches 72, the AC Monitor can be matched to most computers.

In step 407, after reading the switches, the program instructs the CPU to establish all the timer rates. There are three independent clocks in timer 18 (Timer 0, 1 and 2). Timer 0 is for the baud rate of the USART 20. The second clock establishes the timing for the A-D interrupt process ADINT. This is the highest priority interrupt and allows sampling of the waveform to occur at a very high speed. The second clock is stopped in step 407 until it is time to measure waveforms.

The second timer instruction 500 starts the third clock counting every 10th of a second. In this way, the CPU can count elapsed time and can be instructed to output at any desired interval, i.e., every 15 seconds or 15 minutes. By counting in 10ths of a second, the CPU is able to send the output at whatever interval is programmed.

The next step 501 initializes the PIC 16 so that it knows where the different interrupt processes are located in memory. Thus, when the appropriate time occurs, such processes can be given control of the CPU. The PIC 16 has four different input lines which provide data as to which one of the four interrupt processes occurred.

When the interrupt circuits are enabled (step 502), the CPU is ready to be instructed by the USER as to which measurements are to be taken. Up to 168 different commands may be given by the USER who can select any subset of that 168. The commands are stored in memory in the RAM 14. In this way, the CPU is instructed to only measure the quantities selected by the USER.

The point QRESET 505 cancels any previous measuring and allows the receipt of new commands after a "Q" or an "!" message is received. This step occurs on initial start-up of the monitor. When first powered, it runs through the program steps to the QRESET point 505 whereupon the USER enters a selection of measurements. If, subsequently, the USER wants to change a selection, then the monitor can be stopped by entering the "Q" or "!" message. Block 503 indicates the program instruction to set flags, stop sampling, averaging and outputting when a "Q" or "!" is received.

The main program flow continues on FIGS. 6 and 7, as indicated by the main loop blocks 504 and 600. This main program loop runs through its steps over and over to program the CPU to calculate those parameters requested by the USER. For example, if the USER has selected frequency and power to be measured on one circuit and programmed the monitor by suitable commands to find out, every 15 minutes, the average frequency and power for the previous 15 minutes, the CPU will perform the steps indicated in the main loop FIGS. 6–7, for 15 minutes and send out the frequency and the power measurements. The function of this loop is to calculate whatever set of measurements the USER has programmed in. It begins at 601 by zeroing out the memory locations that it uses for storing the frequency and power, or whatever measurements have been selected.

Next, the PARSE routine is run. The PARSE routine (See FIG. 15) is a sub-routine used to look at any input instructions from the USER and to PARSE it., i.e., determines what the instruction is. For example, the PARSE routine determines that FR3 means a frequency measurement is to be made on circuit 3. Once the instructions are PARSED, the CPU waits for a start command 603.

Figure 17:
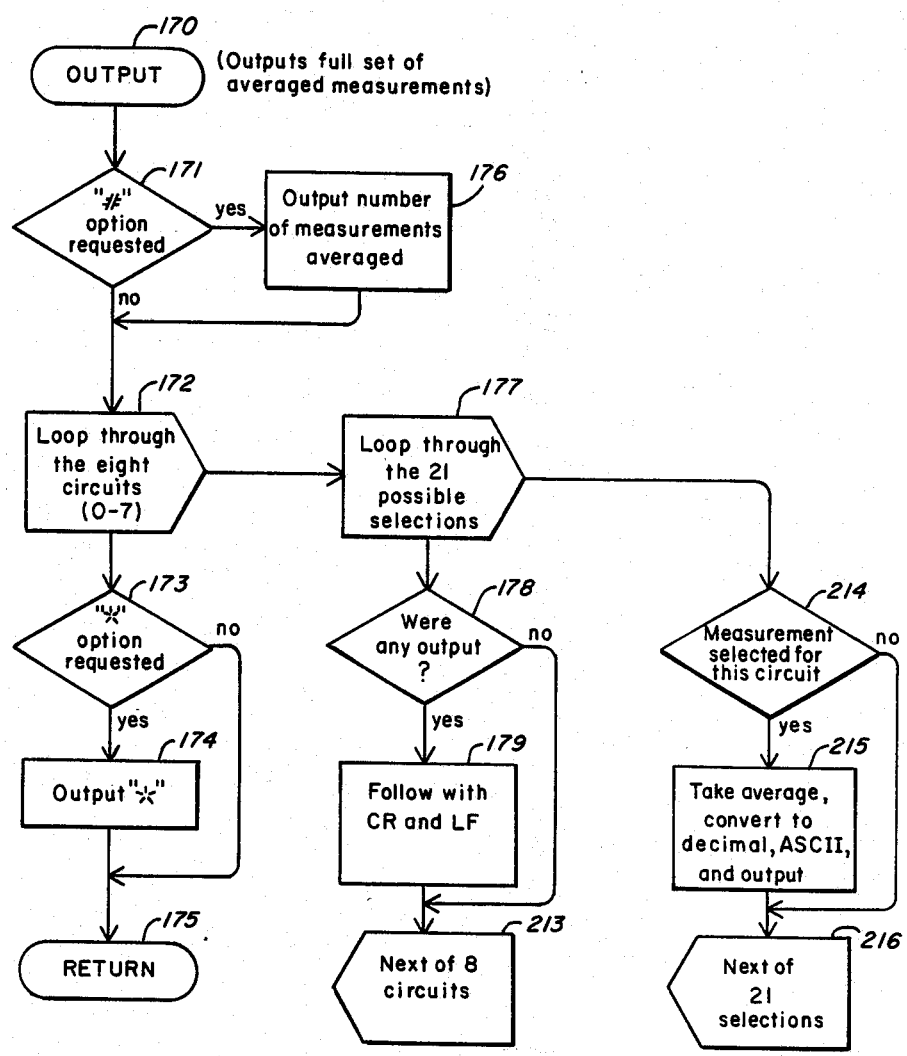

When an S command instruction is sent, it causes a flag to be set and the Averaging Loop routine of FIG. 17 begins and continues.

Decision point 604 is used to prevent an attempt to average a measurement over 65535 measurements. The CPU can only count to 65535, or a 16 bit word. As long as the count of measurement cycles is less than 65535; the average-counter is incremented 605 and the program steps continue through a scan routine loop 606 for the eight circuits. The Scan Routine 608 is described in FIGS. 8 and 9. The CPU runs through this loop for each of the eight circuits unless the USER sends a "Q" or "!" which causes the program to stop scanning and to reset itself 609, 611.

After each scan of the eight circuits, the CPU determines if it is time to output 700. If so, the Output Routine is called 702. The program proceeds back to the main loop 703 where the counters are again set at zero. The CPU is then ready to start sampling over the next period dictated by the USER. If it is not time to output, the CPU proceeds to determine if Mode 2 operation is desired (Step 701).

Mode 2, as previously indicated, is a special mode where the CPU sampling rate is slowed down so that if one is sampling over a long period, such as several hours or half a day, the sampling rate is slowed down so that the counter does not overflow. In this mode, samples are taken once a second. Thus, if the monitor is placed in Mode 2, the decision is "yes" and the program causes the CPU to wait until the end of a second elapses step 704 before recommencing the averaging loop of $A_1$. If the decision is "no", then the program immediately reverts to the A point on FIG. 6, i.e., the averaging loop and proceeds to take another averaging sample.

Scan Routine

The Scan Routine 800 is shown in FIGS. 8, 9, 10 and 11. It is divided into two parts. Most of the quantities that are measured require the process to sample entire waveforms, by measuring the current and voltage over a 60th of a second, and then manipulating the measured data. In a frequency measurement, the waveform need not be stored. Thus the first step in the Scan Routine is to determine if a waveform measurement is required, step 801. If a waveform measurement is not required then the CPU is programmed to run through the Frequency Routine 123. If a waveform measurement is required, then counters, pointers and flags are set for sampling, step 802. Pointers and counters are set to tell the A/D Interrupt Routine which channel to receive, how many measurements to take, and where in memory it can place the samples. Up to 65 current and 64 voltage samples which are interleaved are stored in memory in this fashion.

Next, the timer is set to interrupt step 803. Sampling is done by an A/D Interrupt Routine. A timer is set up 803 which operates at 7680 Hz, so that every 7680th of a second, a sample will be made and the A/D Interrupt Routine will be called. The A/D Interrupt Routine, as will be described, samples the voltage or current at certain points in time and stores the samples in memory.

The first thing that the CPU is programmed to do after the timer is set to interrupt, is to set the variables used for calculation within one cycle to zero, step 804. Next, the CPU addresses each of the sixty-four voltage and current points in storage, calculating the sum of the voltage, the sum of the voltage squared, etc. (step 805). If the values have not been measured yet, decision point 807 causes the CPU to wait until the value is measured and obtains a "yes" indication.

Note that steps 804–811 run simultaneously with the ADINT routine, so that calculations on the waveform can begin before the whole waveform is completely sampled. This makes use of the time between samples so that the whole process is accomplished faster. To do this properly, test 807 is vital to insure that the calculations do not get ahead of the sampling process.

A quick check is made in decision step 808 to determine if a value of −128 has been measured. If such a value has been measured, this would cause an overflow in the computer when the value is squared or multiplied by itself. If this condition occurs, the value is changed to −127, step 811, to prevent an overflow.

Next, the CPU starts calculating the sums 809. It adds every other value to produce a voltage or current sum, which is used to calculate the average voltage or current during a cycle (step 809). This loop occurs for each of 128 measured points. After all 128 are completed, the value computed is stored to be used for calculating the average DC value and the next circuit measurement is taken, step 810. After this loop is finished, the program proceeds to step 806 in which the sums of the voltage and current values are added into a running sum for average DC value measurement. The CPU is then programmed to a similar loop 900, in which the RMS values, square roots of the sum of the voltages squared $\sqrt{\Sigma V^2}$ and the square roots of the sum of the currents squared $\sqrt{\Sigma I^2}$ are calculated. These values are put into memory locations where the values are stored for computing the average value over the selected time period (step 901).

The next step in the program is illustrated on FIG. 10 wherein the steps for calculating real power are shown. If real power is desired to be measured, step 100, then a calculation must be made of the sum of the current and voltage integrated over a time period ($\Sigma IV$), step 102. The formula for this computation is set forth above, in Equation 4. The power for this cycle is then added into a running sum which is used to determine the average power 103. The next step is to determine if the power is greater than zero 104. If it is, then the power measured is added into a sum for determining the average power into a circuit, block 108.

After these power calculations are made, the CPU is instructed to proceed to the reactive power measurement step 101. If a reactive power measurement is to be made, then the CPU can proceed to the calculation of reactive power (step 105). If no such measurement is to be made, then the program continues on to FIG. 11 where the steps in the measurement of THD voltage are shown.

If it is desired to measure reactive power, then the steps for calculation reactive power are programmed (step 105), and added into the sum for the average reactive power (step 106). If the reactive power is greater than zero, then the decision is made (step 107) to add the value into the sum for the average reactive power into a circuit (step 109). If the reactive power is less than zero, or after the reactive power has already been added into the sum (step 109), the CPU proceeds to the measurement of total harmonic distortion, as indicated in FIG. 11.

Figure 11:
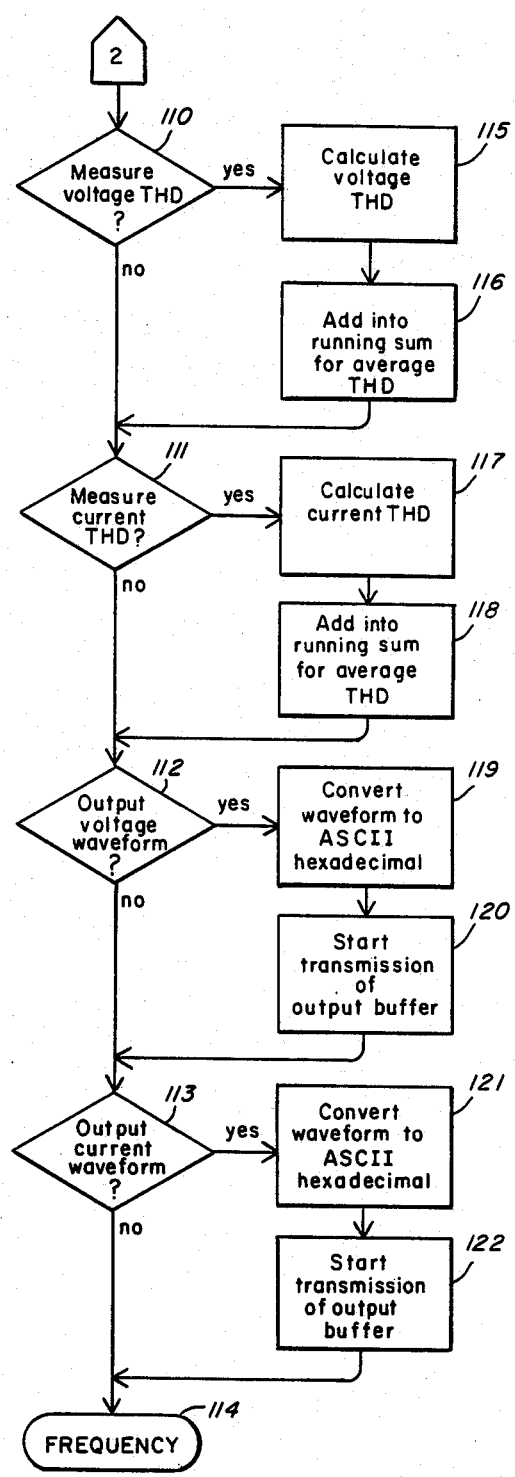

The program steps for measuring four power parameters are shown in the flow diagram of FIG. 11. The first parameter is voltage harmonic distortion (THD). If this quantity is desired to be measured, the CPU is programmed to calculate this in step 115. The calculated measurement is added into a running sum to produce the average total harmonic distortion (step 116). Next, the CPU proceeds to measure the current total harmonic distortion, step 111, if so ordered by the USER. This calculated measurement is added into the running sum to obtain the average total harmonic current distortion, step 118. In like manner, the output voltage waveform, if so desired, may be converted to ASCII hexadecimal format, step 119, if the USER has requested that the voltage waveform be transmitted (step 112).

Once the conversion is made, the transmission is commenced out of the output buffer, step 120. In practice, the first character is transmitted, then the program continues. Then, at some later time after the first character is transmitted, the second character is called out of the buffer. This enables other calculations to continue during the time period for transmitting the complete waveform. An analogous process occurs for transmission of the output current waveform. The decision is made in step 113, to convert the waveform to ASCII hexadecimal in step 121, and it is transmitted to the output buffer in step 122.

Next, the CPU proceeds to determine if a frequency measurement was selected by the USER (See FIG. 12). If frequency was not selected for measurement, then the program steps to branch D of FIG. 14 (Decision step 124), which returns the program from Scan 145, which in turn allows the program to continue after step 608.

If frequency was selected for measurement, step 124 FIG. 12, the input multiplexors are programmed to follow the voltage signal 125, so that the voltage can be timed as it goes through three cycles. A counter is set to time three upward zero crossings of the voltage waveform, step 126. Also, flags are set so that the A-D Interrupt Routine senses that frequency is being measured, step 127. Additionally, a timer is set to interrupt after about five cycles, step 128. This prevents the program from being locked in a frequency measurement loop if there is no signal present at the input, so that no upward zero crossings occur.

Frequency Loop

FIG. 13 shows the steps in the frequency timing loop which essentially counts through the three measuring cycles. The loop starts at the circle A wherein the CPU is programmed to wait for a trough, in which the voltage drops below a negative half of one volt ($-0.5$ V). At the beginning of this loop, the A-D converter is started 132 and the LED is lit to indicate that a measurement is occurring.

Next, a test is made as to whether the allotted time (at about five cycles) has elapsed in decision step 133. If so, then the program continues on FIG. 14, at circle C, wherein the program outputs a frequency of zero 143. If the time has not elapsed, the waveform is computed 134, and the value is compared to $+0.5$ V 135. This sampling and testing is repeated until a trough is found or the allotted time elapses.

When the voltage goes below $-0.5$ V, then the program enters another loop, in which the CPU waits for an upward zero crossing 136, 137, 138, 139. When the voltage is positive after it has already been negative, this indicates the beginning of a cycle. When the first cycle begins 130, the start time is noted and stored 131.

The CPU is programmed to go through these loops three times. At the end of the third time 140, the program branches out to circle B, in which the ending time is recorded in step 141 and the start time is subtracted from the end to get the total period of the three cycles, step 142. This value is added into a counter that provides the total period for the average frequency, step 144. The frequency is later computed from the period of this output time.

In the event there is no signal or if there is a signal that is very slow, the timed-out tests 133 and 137 detect this. Zero is then as a period "." step 143. In other words, if there is no signal, the frequency is indicated as a zero. Note that if the input signal waveform is not perfectly repetitive, the AC Monitor measures the average of the three cycles. The first cycle may be shorter, the other longer than average, but all three are timed and divided by 3 to produce the average frequency.

A/D Interrupt

Figure 18:
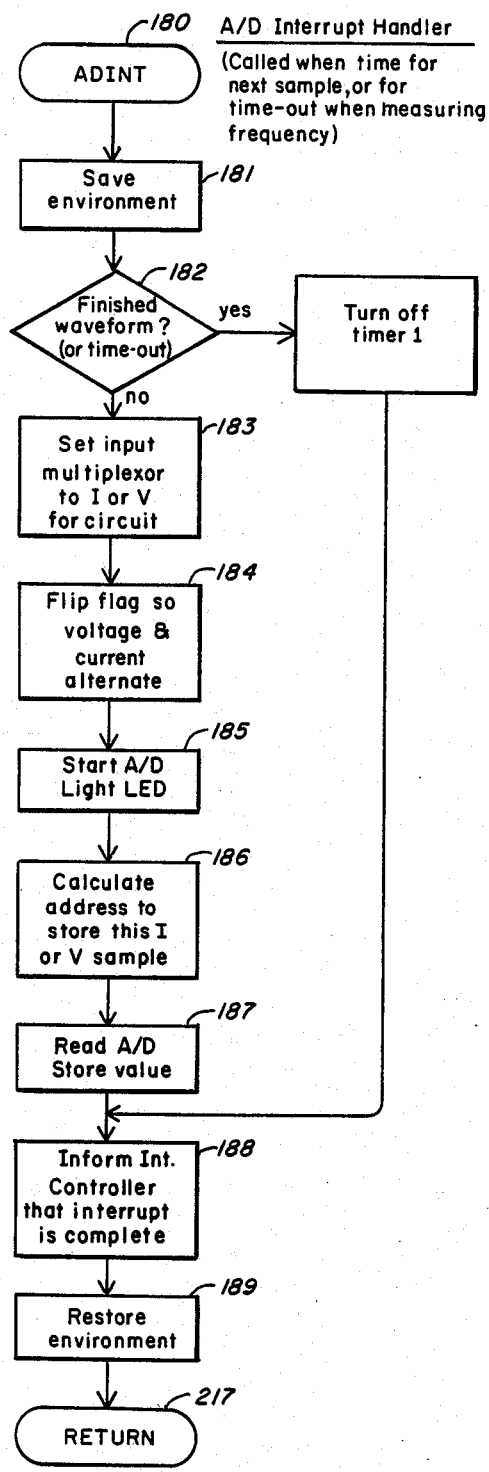

The A-D interrupt handler routine 180 will be described in connection with FIG. 18. This routine is used under two conditions. One, is an interrupt to measure the next sample during waveform collection. The other is an interrupt which occurs when too long a period has elapsed during frequency measurements. This indicates that there is no signal connected to a circuit and the frequency cannot be measured.

The first step in the A-D routine 180 and, in fact, in all the interrupt routines, is to save the environment 181. This is accomplished by storing in the RAM memory the contents of the CPU registers at the time the interrupt occurs, so that the data from the processes being interrupted may be recalled once the interrupt routine is terminated. Thus, as shown in block 189 of the interrupt routine, at the end of the routine, the data stored in these registers during interrupt is returned to the registers upon completion of the routine.

The next step, 182, is to determine if the CPU is in the process of sampling the waveforms. If this process has not been completed, then the program instructs the CPU to proceed to measure the next sample, as indicated by the "no" arrow in step 182. If the CPU has finished measuring the waveform, the decision step 182 instructs the CPU to turn off timer 1 and sets a flag so that if the CPU is measuring frequency, it will sense that it has timed out.

In the sample interrupt loop, the first step is to set the input multiplexors to follow the current or voltage input for a given circuit, step 183. Next, a flag is flipped so that voltage and current are measured, alternately, step 184. Then the A-D converter is allowed to start measurements and the LED light is lit, step 185. While the A-D conversion is being made, the CPU determines the address to store this current or voltage sample, step 186. Then, the value of the A-D conversion is read and stored, step 187. At the end of the interrupt, the programmable interrupt controller is advised that the interrupt is completed, step 188. Lastly, the environment is restored, step 189, and the CPU is programmed to return to the main routine 217 at the point of interrupt.

PARSE Routine

Figure 15:
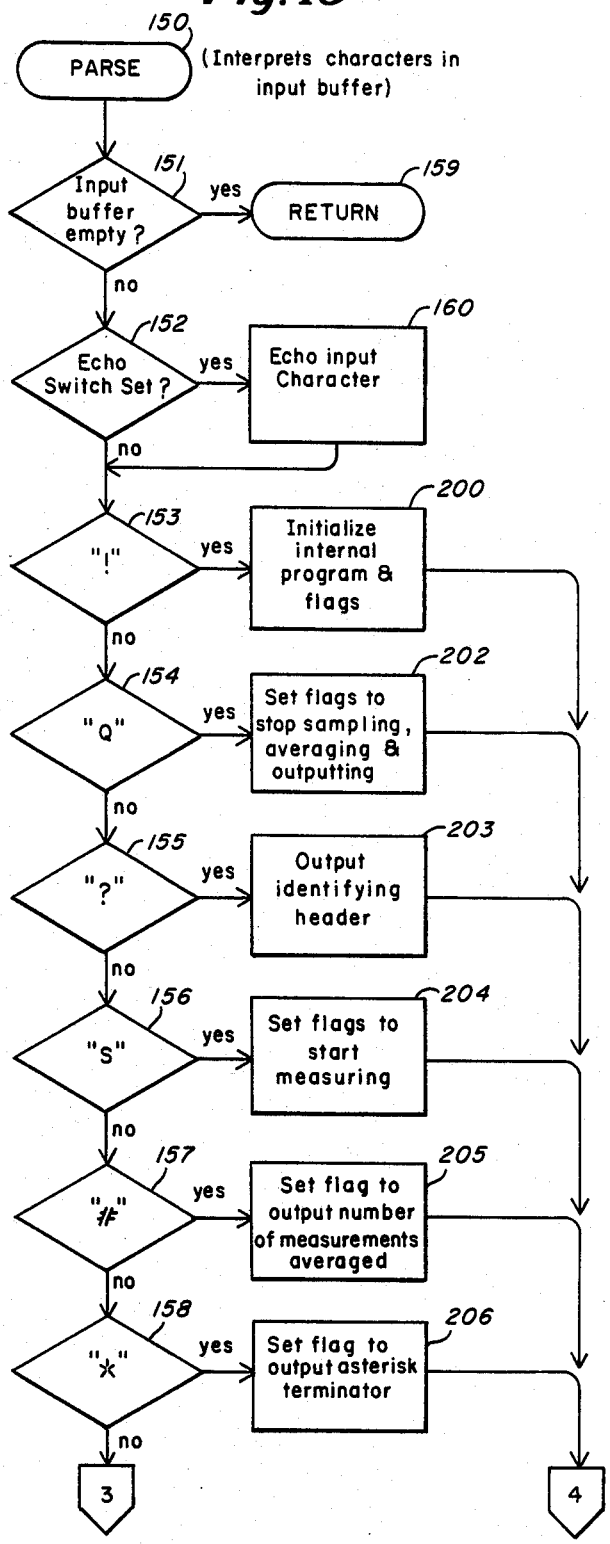
Figure 16:
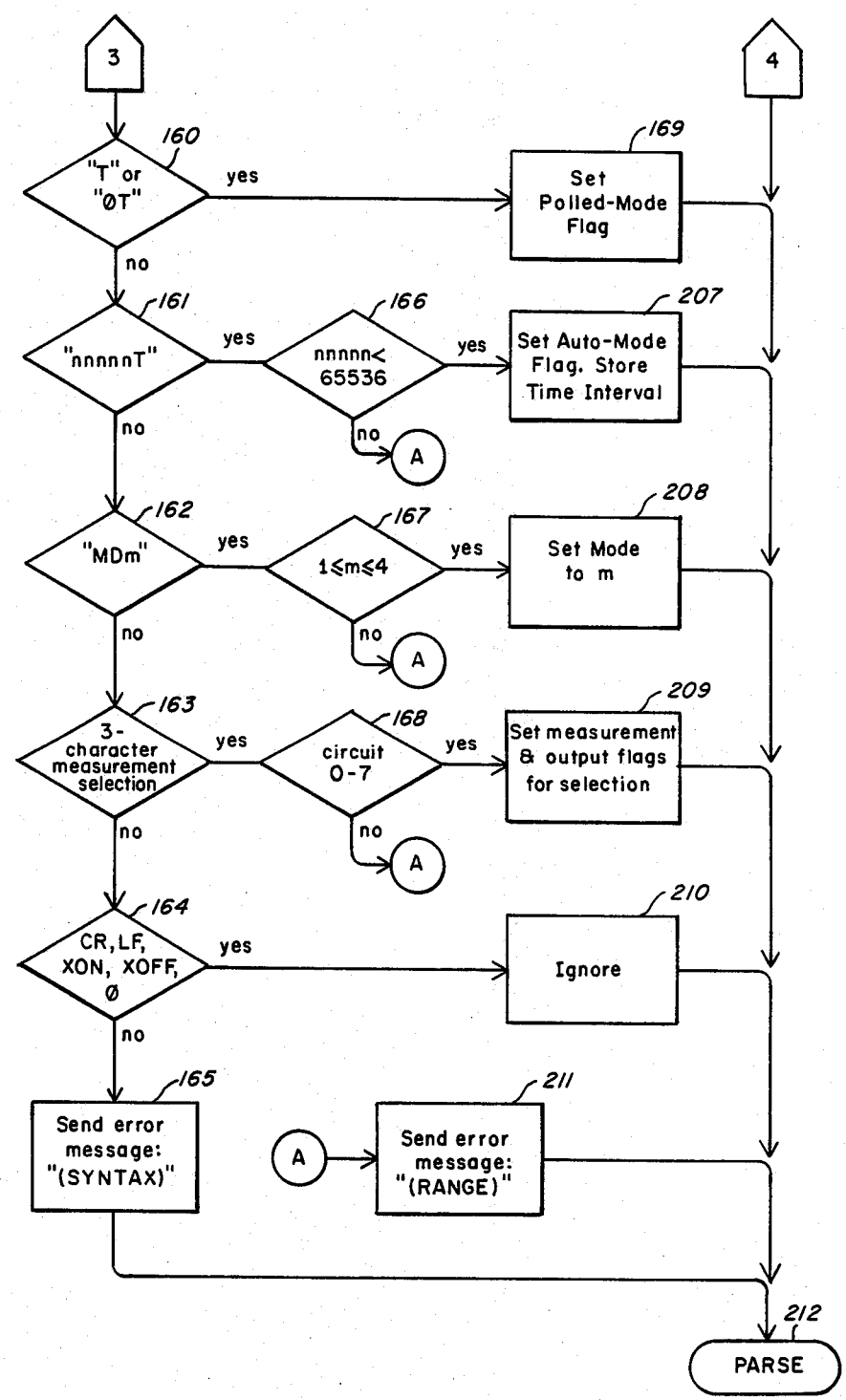

The PARSE Routine will be described in connection with FIGS. 15 and 16. The PARSE Routine is used to check the message characters received from the USER over the communications link and determine what was intended by these characters. For example, if the message FR3 were received to indicate to the AC Monitor to measure the frequency in circuit 3, the characters "FR3" would be stored in the input buffer by the routine RCVRIH described below.

Thus, the first step in the PARSE Routine is to determine if the input buffer is empty. If it is empty, the program decision step 151 is to return to the main program step 159. If the input buffer is not empty, the next step is to determine if the echo switch is set, decision step 152. The echo switch is one of the eight input switches 72, shown in FIG. 3B, coupled to switch monitor 58. This is used in applications where a terminal is used with the AC Monitor, and every time a character is typed on the terminal the AC Monitor returns the transmitted character to the terminal so that the USER can determine that the message was properly communicated. If the echo switch is set then the CPU is programmed to echo the input character, step 160.

Next, the CPU is programmed to perform a series of tests. Depending on the results of these tests, the program branches out, based on which characters are presented at the input buffer. If there is an "!" at the input buffer, decision point 153 requires that the CPU initialize internal programs and flags, step 200. If a "Q" is present, step 154, flags are set to stop sampling, averaging and outputting, step 202. If a "?" is present, step 155, an identifying header, step 203, is sent back to the USER which tells the USER that the AC Monitor is operating. If an "S" is present, this indicates that the AC Monitor should commence measuring, so flags are set to start measuring, step 204.

There are two special commands; a number sign, "#", step 157, and an asterisk, "*", step 158. The number sign is used to send the USER back the number of things measured, so a flag must be set to output the number of measurements averaged, step 205. The asterisk is used as a convenience for program writers on another computer communicating with the AC Monitor. The asterisk indicates that the material requested by the computer has been completed and transmitted, so now the computer can process the information; thus, simplifying the host computer program so that the computer is not required to be concerned with this data until all of it is received. Thus, the asterisk character sets a flag to output the asterisk terminator, step 206.

If the characters "T" or "∅" are present 160 a flag is set 169 which indicates the program is in "polled mode" and should not automatically output its results. If the "T" is preceded by digits, 161, then automatic output is required. The digits "nnnnn" indicate the period (in seconds) in which the measurements are to be transmitted to the host computer or USER. If this message is received, auto mode flags are set and the time interval is stored, step 207. For example, the character 120T requires that the measuring and averaging is to be automatically sent to the USER every two minutes. There is an intermediate test, step 166, whereby if a number is given beyond 65536 seconds, the CPU is programmed to respond to the USER that this is an error and a message is transmitted "(RANGE)" as indicated by step 211.

The mode command character is "MD" followed by a digit which sets up one of the four possible modes, step 162. If the number is outside the range 1–4, a RANGE error message will be sent to the USER, decision step 167. If the number is within the range of 1–4, then the CPU is programmed to the mode indicated by the number, step 208.

In decision step 163, a check is made for 3-character measurement selection, (e.g., FR3). If the circuit selection number is not between 0 and 7, again, an out-of-range error message is sent based on the decision step 168. If the numerical quantity is within 0 to 7, measurement and output flags are set in the memory for the selection, step 209. Decision step 164 relates to certain computer protocol characters (Xon and Xoff) commonly used in computers for special purposes. If the host computer happens to send such characters, the CPU is programmed to ignore them, step 210. It also ignores carriage returns, line feeds and null characters. If a command is sent which the AC Monitor does not recognize, an error message "(SYNTAX)" is sent to the USER, step 165.

Output Routine

The Output Routine will now be described in connection with FIG. 17. This routine 170 is used to output the full set of averaged measurements. At this point in the program, the CPU has made some measurements and accomplished some partial calculations which were stored in memory, but the remainder of the calculations, such as averaging, have not been completed.

The first step in this procedure is to determine if the "#" option was requested, step 171. If it was, then the CPU is programmed to output the number of measurements averaged, step 176. Next, the CPU is programmed to do the complex calculations for each of the eight possible circuits of current voltage. The formulas for these calculations are given above on under the heading *Microprocessor Equations*. After these calculations are made, the CPU is programmed to loop through the twenty-one possible functions that may have been selected and perform whatever calculations are necessary, including taking the average over the averaging period and converting the average to decimal ASCII, step 215 and outputting for each of the twenty-one selections, step 216. After each of the eight circuits is processed, a carriage return and line feed are sent 178, 179.

After the CPU is looped through the eight circuits, a determination is made as to whether the asterisk option was requested; if "Yes", the asterisk is outputted when the data is outputted, step 178.

Transmit Character Interrupt

Figure 19:
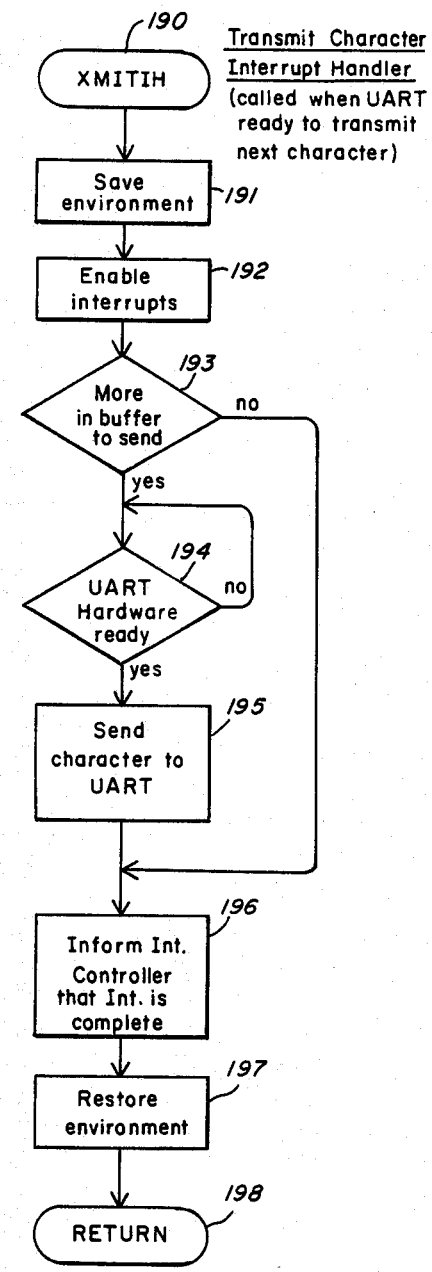

The transmit character interrupt handler XMITIH 190 will now be described in connection with FIG. 19. This interrupt is called upon when the USART is ready to transmit the next character. In common with the other interrupt routines, the first step of this routine is to save the environment 191. Next, interrupts are enabled in step 192 which allows higher priority interrupts (such as ADINT) to interrupt this routine. Then the input buffer is checked, step 193, to determine if there is anything in the buffer to be sent. If not, then the program continues at step 196 below.

If there is data in the buffer to be sent, then the CPU determines if the USART hardware is ready to accept a transmission. If it is not ready, then the CPU is programmed to wait until it is ready, decision step 194. When the USART is ready, the CPU sends the character to the USART, step 195. The programmable interrupt controller is instructed that the interrupt is complete at step 196. The environment is restored, step 197, and the CPU is programmed to return to the main routine, step 198.

Receiver Interrupt Handler

Next, the receiver interrupt handler will be described in connection with FIG. 20. This routine RCVRIH 220 is called upon when the USART receives a character. This routine operates in a manner similar to the previously described transmit character interrupt handler routine, except in the opposite direction. Again, the first step is to save the environment, step 221, and to enable interrupts, step 222. The first test is to determine if there has been a parity or framing error, step 223. If so, the USART is reset, step 232, and an error message (COMMUNICATIONS) is sent to the USER, step 233, and the program continues at step 228. If there is no error in the incoming message, the character is examined to see if it is a "Q" or a "!", 224, 225. If so, flags are set which cause the main routine to stop measuring 231. The character is then stored in an input buffer (in RAM) 227, assuming that there is sufficient room in the buffer. If there is no space in the input buffer, step 226, then the character message is ignored and the interrupt is completed, steps 228, 229 and 230.

Clock Interrupt Handler

The clock interrupt handler routine, step 241 will be described in connection with FIG. 21. The first step is to save the environment, step 242, and enable other interrupts, step 243. The clock interrupt routine is called at regular intervals of every 10th of a second. Its function is to keep track of elapsed time and to determine if there has been a change in the switches, to change the baud rate, for example, while the program is running.

If the switches have been changed, step 244, the switches are read, step 243, the USART is reset for the appropriate parity and stop bits dictated by the switch change, step 254, and timer 3 is reset for the appropriate baud rate, step 255.

One of the switches is a self-test switch. If this switch has been set, step 246, then the self-test routine is called in step 257. If not, the routine proceeds count elapsed time in 10ths of a second, step 245. At the end of every ten counts of one 10th of a second, a second is counted, step 247. If the CPU is programmed for 120 second intervals, when 120 seconds have been accumulated on the seconds counter, step 247, an end of output interval will be indicated, step 248, and the output and control flags will be set, in step 249 which causes the main routine to stop measuring and start output. The program interrupt controller is then informed that the interrupt is complete, step 250, and the environment will be restored, step 251 and the CPU programmed to return to the main program routine, step 252.

Self-Test Routine

Figure 22:
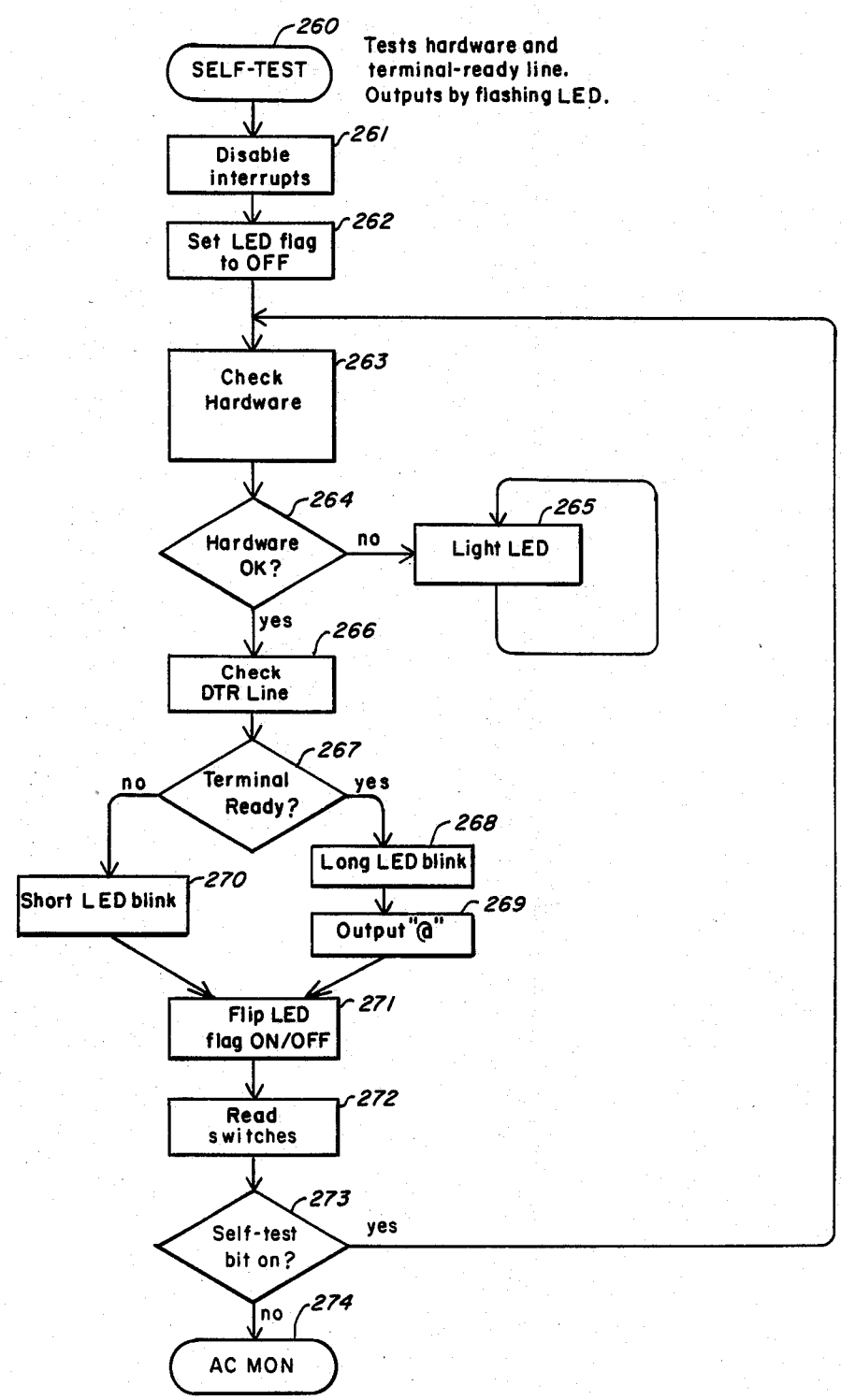

The self-test routine will be described in connection with FIG. 22. The purpose of the self-test routine is to test the hardware to determine if it is operating and to test the terminal line. If everything is ready for communication, then the LED is flashed On and Off once per second. If the AC Monitor is operating but the terminal line is not, then the LED is flashed rapidly. If there is a problem with the AC Monitor hardware, then the LED is lit continuously.

The self-test, step 260, starts by disabling the interrupts, step 261, and setting the LED flag in memory to "Off", step 262, Then the hardware is tested 263. If the hardware test is not acceptable, decision 264, then the LED light is lit continuously, step 265.

The data terminal ready wire to the RS 232 interface is checked. This wire should have a voltage on it if the terminal is turned on and is ready to interface with the AC Monitor. If the terminal is ready, step 267, a long (1 second) LED blink signal is initiated, step 262. If the terminal is not ready, a short LED blink is initiated, step 270. If the terminal is ready the character "@" is sent, step 269, to the terminal.

Next, the LED flag is flipped, so that it blinks alternately On and Off. The switch positions are read, step 272, and again, a determination is made of the status of the self-test switch, step 273. If still "On" then the CPU proceeds to continue with the test. If "Off", the CPU restarts to the AC Monitor routine, step 274.

Equivalents

This completes the description of the preferred embodiment of the invention. Those skilled in the art will realize that it can be varied in many ways, as is apparent in the above-description. For example, in the preferred embodiment, the value of the current used in calculating power is the average of the current sampled before and after the voltage sample. An alternative arrangement could use the voltage before and after each current sample. The invention should therefore only be limited insofar as is required by the scope of the following claims:

What is claimed is:

1. Apparatus for determining the value of a plurality of ac power parameters of a plurality of ac analog circuits each of which have separate analog electrical waveforms propagating in the circuit comprising:
    (a) sampling means for periodically sampling, during a first period of time for each circuit in succession, the analog current and voltage of the waveforms of each circuit a plurality of times during each cycle of the waveforms and over at least several cycles of the waveforms;
    (b) converting means for converting, during said first period of time, the ac current and voltage samples to digital signals proportional to the current or voltage value of the samples;
    (c) storage means for storing such digital signals during said first period of time;
    (d) computing means for calculating and averaging certain non-derived values of power parameters of the circuits directly from such digital signals during intervals between taking of samples and storing such values, and, during a second later variable time period for each circuit deriving the values of additional power parameters from such stored values and, for adding the calculated values into running sums and storing said sums during a third later time period for each circuit, and during a fourth later time period, averaging the stored sums selected for outputting; and
    (e) output means for interfacing said computing means with a data communications system whereby certain values can be selected for calculation and outputted.

2. The apparatus of claim 1 including frequency measurement means for calculating the frequency of the analog current and voltage waveforms of each circuit, during a fifth time period prior to said third time period, by timing several cycles of the waveforms using the zero crossover point of the waveform as the starting point and dividing by the number of cycles timed.

3. The apparatus of claim 1 in which one of the non-derived values is the RMS voltage and the computing means includes means for calculating the RMS voltage voltage by sampling the waveform and computing RMS voltage, as follows:

$$\text{AVG}\sqrt{\frac{\Sigma V_i^2}{n}}$$

wherein n=number of samples taken per cycle and $V_i$=voltage value of each i-th sample.

4. The appratus of claim 1 in which one of the non-derived values is ac power and the computer means includes means for calculating ac power by integrating and averaging the product of each current and voltage sample.

5. The apparatus of claim 4 wherein the current used in the calculation is the average of the current sampled before and after the voltage sample and the means for calculating ac power includes means for averaging said sampled current.

6. The apparatus of claim 4 wherein the voltage used in the calculation is the average of the voltage sampled before and after the current sample and the means for calculating ac power includes means for averaging said sampled voltage.

7. The apparatus of claim 1 in which the derived values are one or more of the following group and means are provided for calculating said derived values as follows:

Apparent power $= AP = IR \times VR$

Power Factor $= PF = PR/(IR \times VR)$

Resistance $= PR = RR/IR^2$

Reactance $= ZX = RP/IR^2$

Conductance $= YG = PR/VR^2$

Susceptance $= YB = -RP/VR^2$

8. The apparatus of claim 7 in which the derived values are calculated based on the averaged values of RMS voltage VR, RMS current IR, real power PR, and reactive power RP and means are provided for calculating said average values and said derived values, as follows:

$AP = IR \times VR$ $PF = PR/(IR \times VR)$ $ZR = PR/IR^2$ $ZX = RP/IR^2$ $YG = PR/VR^2$ $YB = -RP/VR^2$ 9. The apparatus of claim 1 in hwich the sampling means includes means for sampling the analog current and voltage samples alternately and coupling each circuit successively to the analog to digital means.

10. The apparatus of claim 9 including means for alternately sampling the current and voltage values.

11. The apparatus of claim 1 includng means for determining the rate at which the sampling means samples the waveforms of each circuit and time when the averaged stored sums are outputted in one of two alternate modes comprising:
  (i) an automatic mode in which the output is automatically supplied at fixed time intervals; or
  (ii) a polled mode in which the output is only supplied upon demand.

12. Apparatus for determining the value of a plurality of ac power parameters of a plurality of ac analog circuits each of which have separate analog electrical waveforms propagating in the circuit comprising:
  (a) sampling means for periodically sampling, during a first period of time for each circuit in succession, the analog current and voltage of the waveforms of each circuit a plurality of times during each cycle of the waveforms and over at least several cycles of the waveforms;
  (b) converting means for converting the ac current and voltage samples to digital signals proportional to the current or voltage value of the samples;
  (c) storage means for storing such digital signals;
  (d) computing means for calculating and averaging certain non-derived values of power parameters of the circuits directly from such digital signals during intervals between the taking of samples and storing such values, and, for adding the calculated values into running sums and storing said sums during a later time period for each circuit, and during a later period of time, averaging the stored sums selected for outputting; and
  (e) output means for interfacing said computing means with a data communications system whereby certain values can be selected for calculation and outputted.

13. The apparatus of claim 1 or 12 in which one of the non-derived values is total harmonic distortion (THD) for a current or voltage waveform and means are provided for calculating RMS voltage by computing the RMS value of the fundametal frequency of the waveform ($A_F$) using Fourier integrals; substracting this RMS value from the RMS value of the waveform, $A_{RMS}$ and normalizing the resultant value to the fundamental, and multiplying by 100 to yield a percentage as follows:

$$A_F^2 = \frac{2}{N^2} \left[ \left( \Sigma W_i \sin \frac{(2\pi i)}{N} \right)^2 + \left( \Sigma W_i \cos \frac{(2\pi i)}{N} \right)^2 \right]$$

$$THD = AVG \left\{ 100 \sqrt{\frac{A_{RMS}^2 - A_F^2}{A_F^2}} \right\}$$

wherein:
  N = number of samples taken per cycle
  $W_i$ = current or voltage value of ith sample.

14. The apparatus of claim 12 wherein one of the non-derived values is real power which is calculated as the sum of the current and voltage, and wherein the current value, at a time synchronous with any voltage value $V_i$, is approximated by averaging the current values immediately preceding the voltage measurement, $I_{i-\frac{1}{2}}$, and following the voltage measurement, $I_{i+\frac{1}{2}}$, so that real power PR is computed as a known constant times the average of the sum of $V_i(I_{i-\frac{1}{2}} + I_{i+\frac{1}{2}})$.

15. The apparatus of claim 12 wherein one of the non-derived values is real power which is calculated as the sum of the current and voltage, and wherein the voltage value, at a time synchronous with any current value $I_i$, is approximated by averaging the voltage values immediately preceding the current measurement, $V_{i-\frac{1}{2}}$, and following the current measurement, $V_{i+\frac{1}{2}}$, so that real power PR is computed as a known constant times the average of the sum of $I_i(V_{i-\frac{1}{2}} + V_{i+\frac{1}{2}})$.

16. The method of determining the value of a plurality of ac power parameters of a plurality of ac analog circuits each of which have separate analog electrical waveforms propagating in the circuit comprising the steps of:
  (a) periodically sampling, during a first period of time for each circuit in succession, the analog current and voltage waveforms of each circuit a plurality of times during each cycle of the waveform and over at least several cycles of the waveforms;
  (b) converting, during said first period of time, the ac current and voltage samples to digital signals proportional to the current or voltage value of the samples;

(c) storing such digital signals during said first period of time;

(d) calculating and averaging certain non-derived values of power parameters of the circuits directly from such digital signals during intervals between taking of samples and storing such values, and, during a second later variable time period for each circuit deriving the values of additional power parameters from such stored values and, for adding the calculated values into running sums and storing said sums during a third later time period for each circuit, and during a fourth later time period, averaging the stored sums selected for outputting.

17. The method of claim 16 including the step of, during a fifth period of time, measuring the frequency of the analog current and voltage waveforms by timing several cycles of the waveforms using the zero crossover point of the waveform as the starting point and dividing by the number of cycles timed.

18. The apparatus of claim 16 wherein the sampling of either the current or voltage value occurs before and after the sampling of the value.

19. The method of claim 16 wherein during step (d), a table of squares is generated for use in RMS calculations and such table is stored.

20. The method of claim 16 wherein the values to be calculated are selected in accordance with instructions stored in memory.

21. The apparatus of claim 16 wherein the sampling of the voltage value occurs about half-way between successive samples of current value.

22. The apparatus of claim 16 wherein the sampling of the current value occurs about half-way between successive samples of the voltage value.

* * * * *

UNITED STATES PATENT AND TRADEMARK OFFICE
CERTIFICATE OF CORRECTION

PATENT NO. : 4,672,555

DATED : Jun. 9, 1987

INVENTOR(S) : George W. Hart and Edward C. Kern, Jr.

It is certified that error appears in the above—identified patent and that said Letters Patent is hereby corrected as shown below:

Col. 26, lines 48/49, delete "voltage", second occurrence.

Col. 27, line 39, delete "hwich" and insert ---which---.

Col. 28, line 15, delete "fundametal" and insert ---fundamental---.

Signed and Sealed this

Third Day of November, 1987

Attest:

DONALD J. QUIGG

Attesting Officer

Commissioner of Patents and Trademarks